(12) United States Patent
Jeon et al.

(10) Patent No.: US 11,678,521 B2
(45) Date of Patent: Jun. 13, 2023

(54) DISPLAY DEVICE AND METHOD OF MANUFACTURING THE SAME

(71) Applicant: Samsung Display Co., Ltd., Yongin-si (KR)

(72) Inventors: Joo Hee Jeon, Yongin-si (KR); Tae Hoon Yang, Yongin-si (KR); Gun Hee Kim, Yongin-si (KR); Sung Jin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 85 days.

(21) Appl. No.: 17/081,830

(22) Filed: Oct. 27, 2020

(65) Prior Publication Data

US 2021/0202626 A1 Jul. 1, 2021

(30) Foreign Application Priority Data

Dec. 27, 2019 (KR) .................... 10-2019-0176610

(51) Int. Cl.
| | | |
|---|---|---|
| *H01L 27/32* | (2006.01) | |
| *H01L 51/52* | (2006.01) | |
| *H01L 51/56* | (2006.01) | |

(52) U.S. Cl.
CPC ...... *H01L 27/3246* (2013.01); *H01L 27/3258* (2013.01); *H01L 51/5225* (2013.01); *H01L 51/56* (2013.01); *H01L 2227/323* (2013.01)

(58) Field of Classification Search
CPC ............. H01L 27/3246; H01L 27/3258; H01L 51/5225; H01L 51/56
USPC ......................................................... 257/72
See application file for complete search history.

(56) References Cited

U.S. PATENT DOCUMENTS

| | | | |
|---|---|---|---|
| 9,564,611 B2 | 2/2017 | Moon et al. | |
| 9,911,941 B2 | 3/2018 | Choi et al. | |
| 2012/0074435 A1* | 3/2012 | Ha ...................... | H01L 27/3209 257/E33.012 |
| 2013/0187131 A1* | 7/2013 | Chung ................ | H01L 51/5296 257/40 |

(Continued)

FOREIGN PATENT DOCUMENTS

| | | |
|---|---|---|
| KR | 10-2016-0130042 A | 11/2016 |
| KR | 10-2017-0113066 A | 10/2017 |
| WO | 2018/061102 A1 | 4/2018 |

OTHER PUBLICATIONS

Su, Wei-Fang et al., "Thermal properties of high refractive index epoxy resin system," Thermochimica Acta, 2002, pp. 385-389.

*Primary Examiner* — Dzung Tran
(74) *Attorney, Agent, or Firm* — Lewis Roca Rothgerber Christie LLP

(57) ABSTRACT

A display device, includes: a substrate including pixel areas and a transmissive area between the pixel areas; a pixel circuit layer including at least one transistor on each of the pixel areas; and a light-emitting element layer on the pixel circuit layer and including at least one light-emitting element at each of the pixel areas and coupled to the at least one transistor, and a transparent organic layer at the transmissive area, wherein the light-emitting element layer further includes: a first electrode at the pixel areas, a first inorganic layer at the first electrode, an organic layer covering the first inorganic layer and the transparent organic layer, and a second inorganic layer on the organic layer.

13 Claims, 24 Drawing Sheets

(56) References Cited

U.S. PATENT DOCUMENTS

| | | |
|---|---|---|
| 2017/0053971 A1 | 2/2017 | Sato |
| 2017/0221982 A1* | 8/2017 | Park .................... H01L 51/5271 |
| 2017/0294502 A1* | 10/2017 | Ka ...................... H01L 27/3276 |
| 2017/0309651 A1* | 10/2017 | Kim ...................... G02F 1/1345 |
| 2018/0097034 A1* | 4/2018 | Lee .................... H01L 23/5329 |
| 2019/0130822 A1 | 5/2019 | Jung et al. |
| 2019/0319220 A1 | 10/2019 | Hirasawa |
| 2019/0393444 A1 | 12/2019 | Nam et al. |
| 2020/0035954 A1 | 1/2020 | Yoshida |

\* cited by examiner

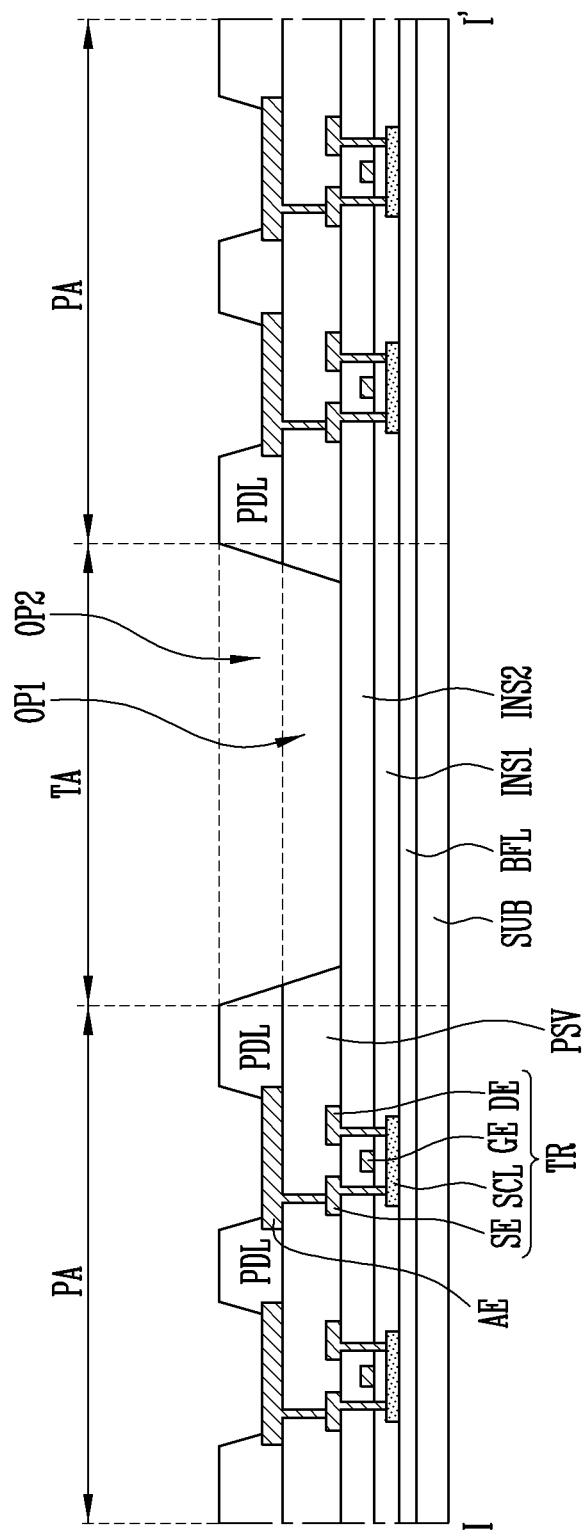

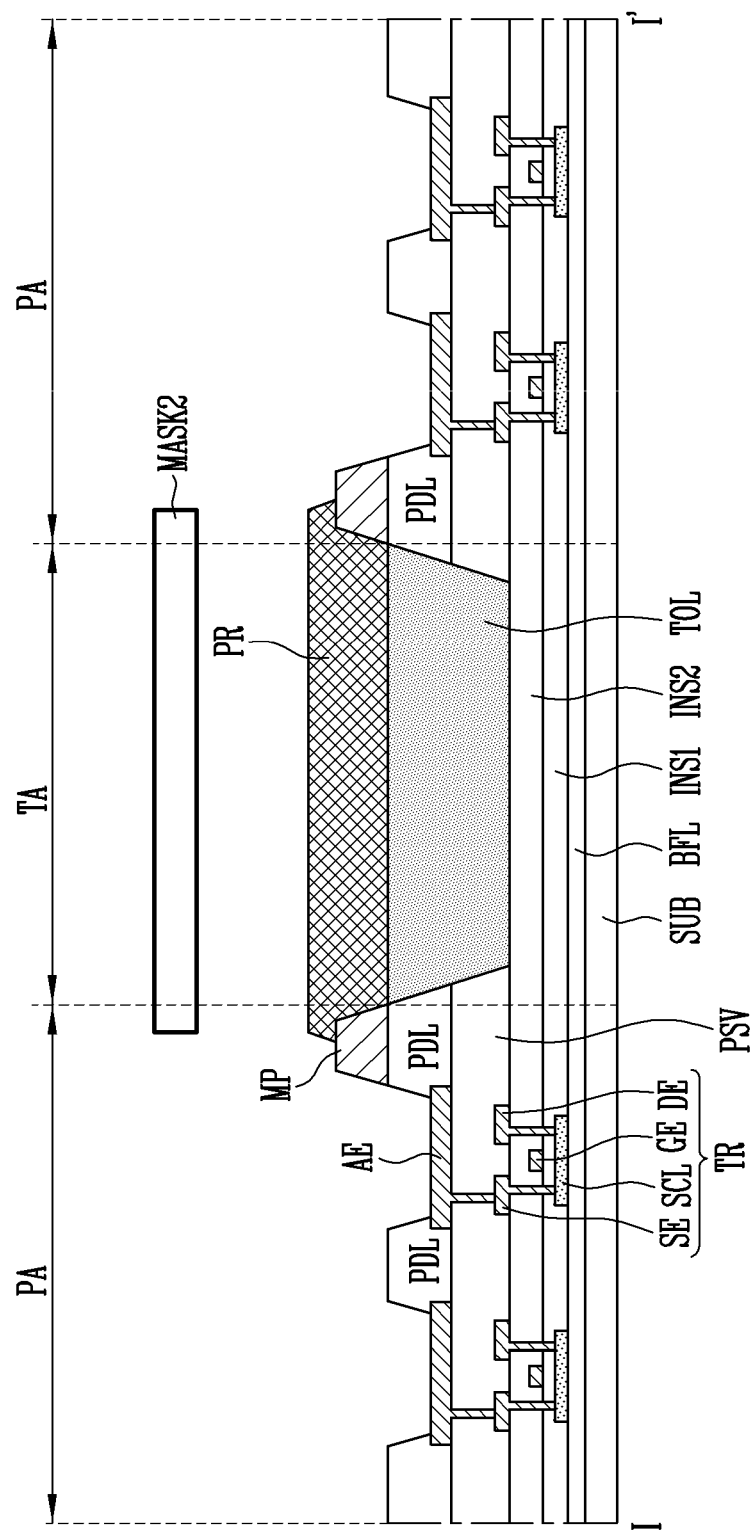

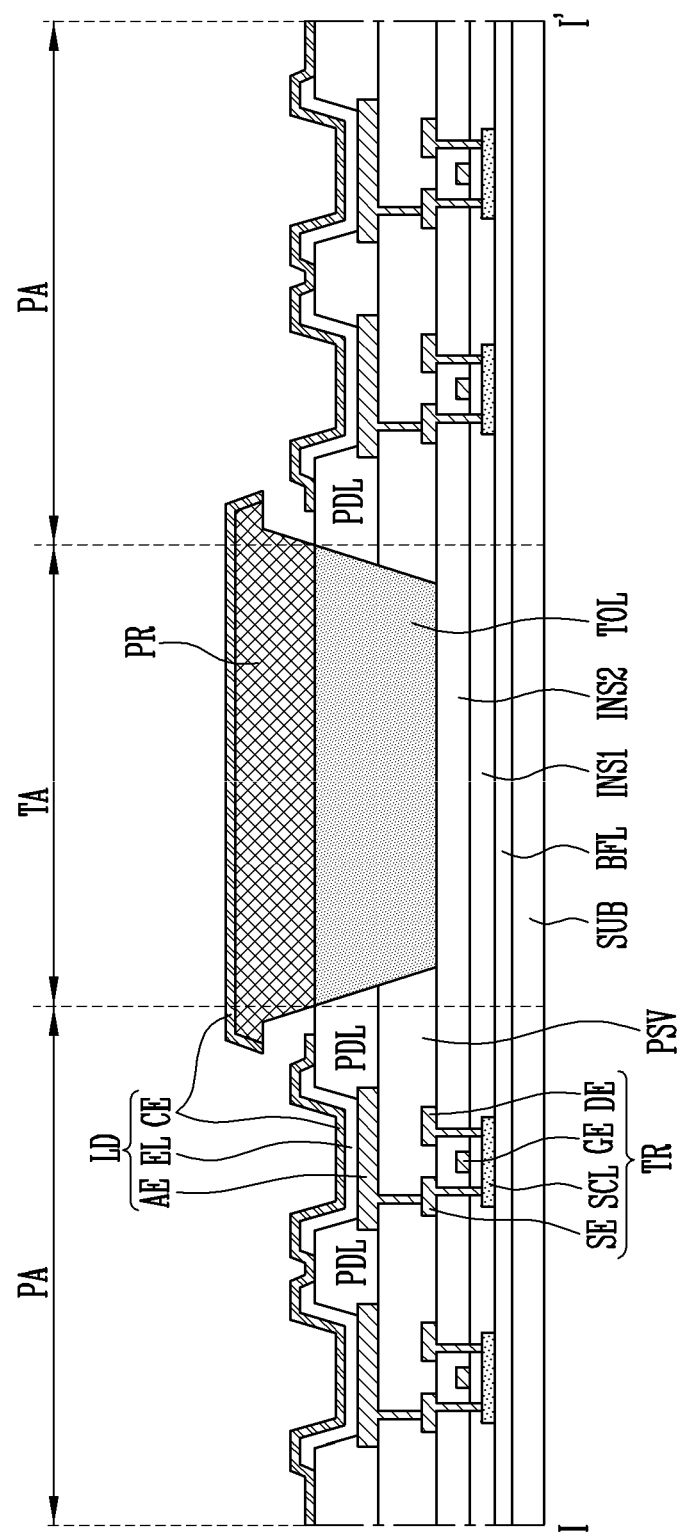

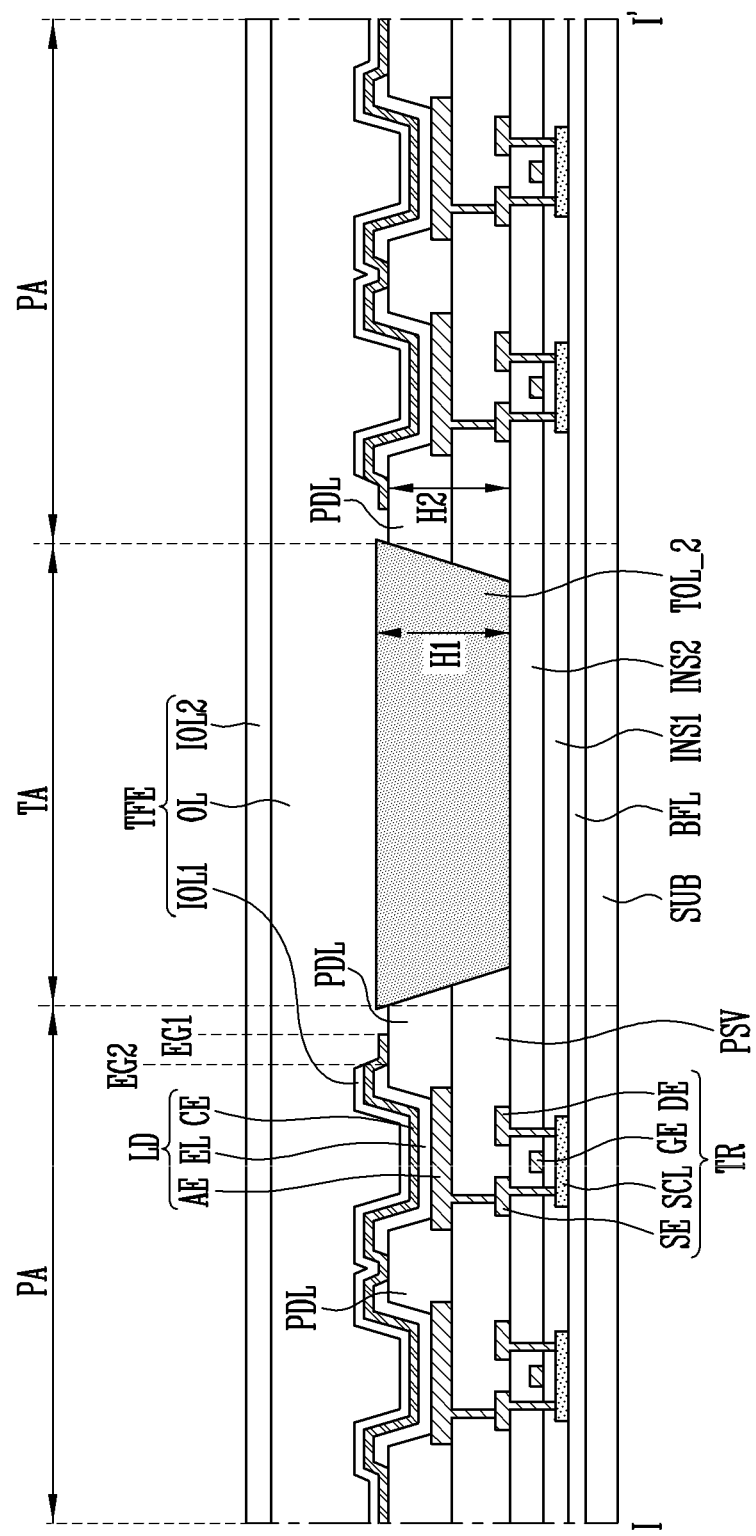

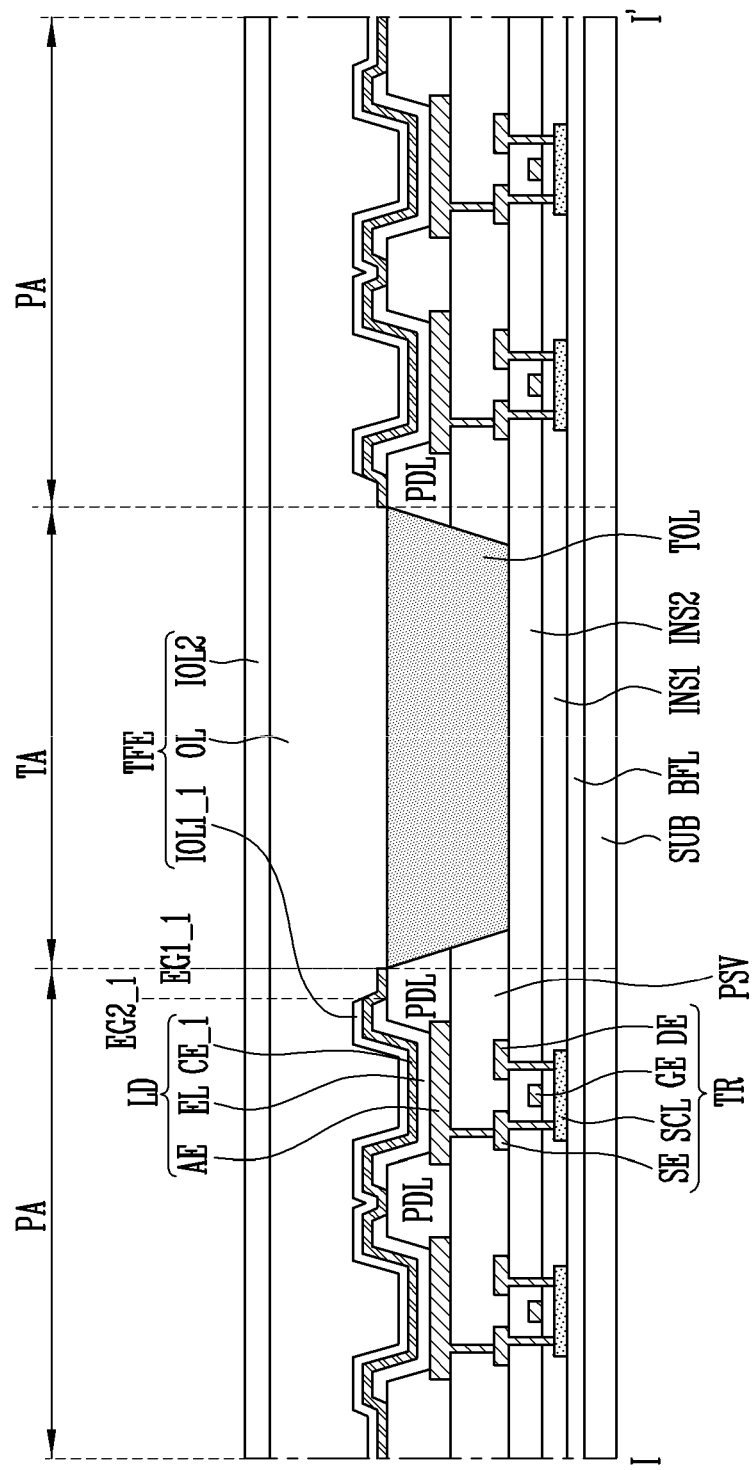

DISPLAY DEVICE AND METHOD OF MANUFACTURING THE SAME

CROSS-REFERENCE TO RELATED APPLICATION

The present application claims priority to and the benefit of Korean patent application No. 10-2019-0176610, filed on Dec. 27, 2019, the entire disclosure of which is incorporated herein in its entirety by reference.

BACKGROUND

1. Field

Aspects of some example embodiments of the present disclosure relate to a display device and a method of manufacturing the same.

2. Related Art

Display devices may have various kinds of sensors. For example, a display device may recognize an object using an optical sensor and acquire pictures and moving images using a camera. Full display technology configured to display an image on the entire front surface of a display device by minimizing or removing the bezel of the front surface of the display device and by rearranging the sensors of the front surface may be utilized.

A display panel may include a transmissive window (or a transmissive component), which is located between light-emitting pixels and configured to transmit light, and a sensor below the display panel may sense a signal through the transmissive window.

The sensitivity of the sensor may change depending on the transmittance of the transmissive window, and the cathode electrode and the like of a pixel inside the transmissive window may be removed in order to improve the sensitivity of the sensor.

The cathode electrode of the pixel inside the transmissive window may be removed using laser, but the transmissive window may not have a sufficient area due to a laser margin (that is, the margin for preventing a laser from damaging an adjacent pixel circuit).

The above information disclosed in this Background section is only for enhancement of understanding of the background and therefore the information discussed in this Background section does not necessarily constitute prior art.

SUMMARY

Aspects of some example embodiments of the present disclosure are directed to a display device that includes a transmissive window having a sufficient area and a method of manufacturing the display device.

The characteristics of embodiments according to the present disclosure are not limited to the above-mentioned characteristics, and other technical characteristics that are not mentioned will be more readily understood by a person of ordinary skill in the art from the following description.

According to some example embodiments of the present disclosure, a display device may include a substrate including pixel areas and a transmissive area between the pixel areas; a pixel circuit layer including at least one transistor at each of the pixel areas; and a light-emitting element layer on the pixel circuit layer and including at least one light-emitting element at each of the pixel areas and coupled to the at least one transistor, and a transparent organic layer at the transmissive area. The light-emitting element layer may further include a first electrode at the pixel areas, a first inorganic layer on the first electrode, an organic layer configured to cover the first inorganic layer and the transparent organic layer, and a second inorganic layer on the organic layer.

According to some example embodiments, the first electrode and the first inorganic layer may not overlap the transparent organic layer, and the first electrode and the first inorganic layer may be spaced apart from the transparent organic layer in a plan view.

According to some example embodiments, one side of the first electrode facing the transparent organic layer may include a straight line.

According to some example embodiments, the first edge of the first electrode may be closer to the transparent organic layer than the second edge of the first inorganic layer, and a portion of the first electrode exposed by the first inorganic layer may be in contact with the organic layer.

According to some example embodiments, the distance between the first edge of the first electrode and the second edge of the first inorganic layer may be equal or similar to the thickness of the first electrode.

According to some example embodiments, the light-emitting element layer may further include a second electrode on the pixel circuit layer, a pixel defining layer on the second electrode and configured to expose the second electrode, and an emission layer overlapping the second electrode exposed by the pixel defining layer, and the first electrode, the second electrode, and the emission layer may configure the at least one light-emitting element.

According to some example embodiments, with respect to the substrate, the height of the upper surface of the transparent organic layer may be equal to the height of the pixel defining layer.

According to some example embodiments, with respect to the substrate, the height of the upper surface of the transparent organic layer may be lower than the height of the pixel defining layer.

According to some example embodiments, with respect to the substrate, the height of the upper surface of the transparent organic layer may be higher than the height of the pixel defining layer.

According to some example embodiments, the substrate may further include a first area and a second area. In the first area, the pixel areas of the substrate may be arranged in a grid shape so as to be spaced apart from each other, and the transmissive area may be located between the pixel areas spaced apart from each other. In the second area, the pixel areas of the substrate may be adjacent to each other.

According to some example embodiments, the first electrode may be continuously formed on the pixel areas, and the thickness of the first electrode may be uniform throughout the entire pixel areas.

According to some example embodiments, the first inorganic layer may include inorganic patterns that are separated from each other, and the inorganic patterns may be at the pixel areas, respectively.

According to some example embodiments, the refractive index of the transparent organic layer may be within a range of 1.5 to 1.7.

According to some example embodiments, the first electrode and the first inorganic layer may not overlap the transparent organic layer, and the first edge of the first electrode may coincide with the edge of the transparent organic layer in a plan view.

According to some example embodiments, the second edge of the first inorganic layer may be spaced apart from the transparent organic layer in a plan view.

According to some example embodiments, the first lateral side of the first electrode and the second lateral side of the first inorganic layer, facing the transparent organic layer, may be located on the same surface as the lateral side of the transparent organic layer.

According to some example embodiments, the first electrode may partially overlap the transparent organic layer, and the first inorganic layer may not overlap the transparent organic layer.

According to some example embodiments of the present disclosure, in a method of manufacturing a display device, the method may include preparing a panel including a plurality of insulating layers on a substrate, at least one transistor formed between the insulating layers in each of the pixel areas of the substrate, and a groove formed by penetrating through at least one of the insulating layers in a transmissive area of the substrate, the transmissive area being located between the pixel areas; forming a dummy pattern on the insulating layers along the edge of the transmissive area; forming a transparent organic layer in the groove of the transmissive area; forming photoresist on the transparent organic layer; eliminating the dummy pattern; forming a light-emitting element on the substrate; forming a first inorganic layer on the entire substrate; and stripping the photoresist.

According to some example embodiments, the method may further include forming an organic layer configured to cover the transparent organic layer, exposed by stripping the photoresist, and the first inorganic layer; and forming a second inorganic layer on the organic layer.

According to some example embodiments, forming the light-emitting element may include forming an emission layer in the pixel areas; and forming a first electrode on the entire substrate using a chemical vapor deposition technique. The first electrode may be discontinuous between the transmissive area and the pixel areas by the photoresist.

Further details according to some example embodiments are included in the detailed description and the drawings.

BRIEF DESCRIPTION OF THE DRAWINGS

FIGS. 6A to 6J are views for explaining a method of manufacturing a display device according to some example embodiments.

FIG. 7A and FIG. 7B are cross-sectional views illustrating another example of a display device, taken along the line I-I' of FIG. 3.

FIG. 8A is a cross-sectional view illustrating yet another example of a display device, taken along the line I-I' of FIG. 3.

DETAILED DESCRIPTION

Figure 1:
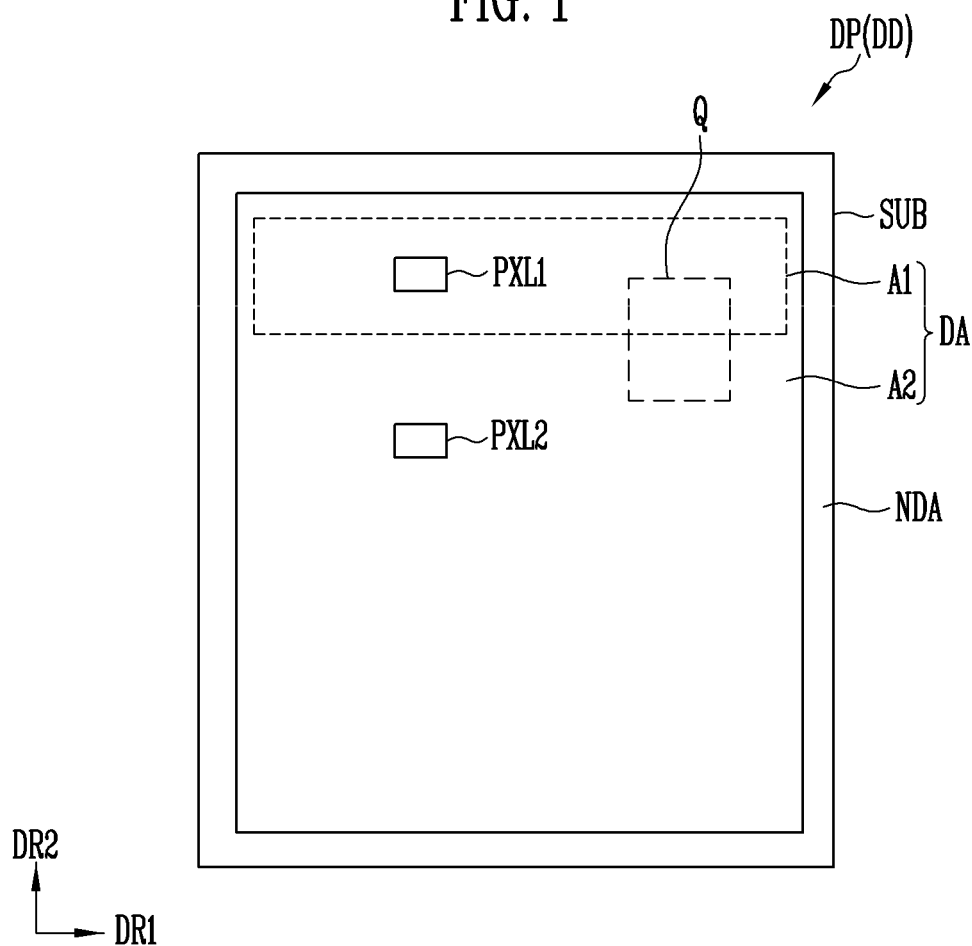
FIG. 1 is a view illustrating a display device according to some example embodiments.

Other characteristics and features of some example embodiments of the present disclosure, and methods for achieving the same will become more clear with reference to embodiments described later in more detail together with the accompanying drawings. However, embodiments according to the present disclosure are implemented in various forms without being limited to embodiments, which will be described later, and these embodiments are provided so that this disclosure will be thorough and complete and will fully convey the scope of the present disclosure to those skilled in the art. Embodiments according to the present disclosure should be defined by the scope of the accompanying claims and their equivalents.

A case where an element or a layer is designated as being located or arranged "on" another element or layer may include all cases where an additional layer or element is interposed therebetween. The same reference numerals are used to designate the same components throughout the specification.

Although the terms "first" and "second" are used to describe various components, but it is apparent that those components are not limited by the terms. These terms are merely used to distinguish one component from another component. Therefore, it is apparent that a first component, which will be described below, may also be a second component without departing from the technical spirit of the present disclosure. In the present disclosure, the singular forms are intended to include the plural forms as well, unless the context clearly indicates otherwise.

Hereinafter, further details and characteristics of some example embodiments of the present disclosure will be described with reference to the attached drawings. The same or similar reference numerals are used to designate the same components throughout the drawings.

FIG. 1 is a view illustrating a display device according to some example embodiments. In FIG. 1, a display panel DP provided in a display device DD is illustrated. According to some example embodiments, the structure of the display panel DP based on a display area DA is schematically illustrated in FIG. 1. However, at least one driver (e.g., a scan driver and a data driver) and/or a plurality of lines may be further located in the display panel DP.

Referring to FIG. 1, the display device DD may include a substrate SUB and pixels PXL1 and PXL2 located on the substrate SUB.

The substrate SUB may configure the base member of the display panel DP.

According to some example embodiments, the substrate SUB may be a rigid substrate or a flexible substrate, and the material or property thereof is not limited to any specific material or property. For example, the substrate SUB may be a rigid substrate configured with glass or tempered glass or a flexible substrate configured with plastic or a thin film made of metal. Also, the substrate SUB may be a transparent substrate, but is not limited thereto.

One area on the substrate SUB may be defined as the display area DA such that the pixels PXL1 and PXL2 are located therein, and the remaining area may be defined as a non-display area NDA. For example, the substrate SUB may include the display area DA including pixel areas in which the pixels PXL1 and PXL2 are formed and the non-display area NDA located outside the display area DA. Various types of lines coupled to the pixels PXL1 and PXL2 of the display area DA and/or an embedded circuit may be located in the non-display area NDA.

According to some example embodiments, the display area DA may be located in the center of the display panel DP, and the non-display area NDA may be located along the edge of the display panel DP so as to surround the display area DA. However, the positions of the display area DA and the non-display area NDA are not limited to this example, and the positions of the display area DA and the non-display area NDA may be variously changed.

According to some example embodiments, the display area DA (or the substrate SUB) may include a first area A1 (or a first display area) and a second area A2 (or a second display area). The first area A1 and the second area A2 may be differentiated depending on the resolution of the pixels PXL1 and PXL2 (or the resolution per unit area and the density), and the resolution of the first pixel PXL1 inside the first area A1 may be lower than the resolution of the second pixel PXL2 inside the second area A2.

As illustrated in FIG. 1, the first area A1 may be located in the upper side of the display panel DP, but this is an example. The position and size (or the area) of the first area A1 may be variously changed in accordance with a sensor (e.g., UPS in FIG. 2).

Figure 2:
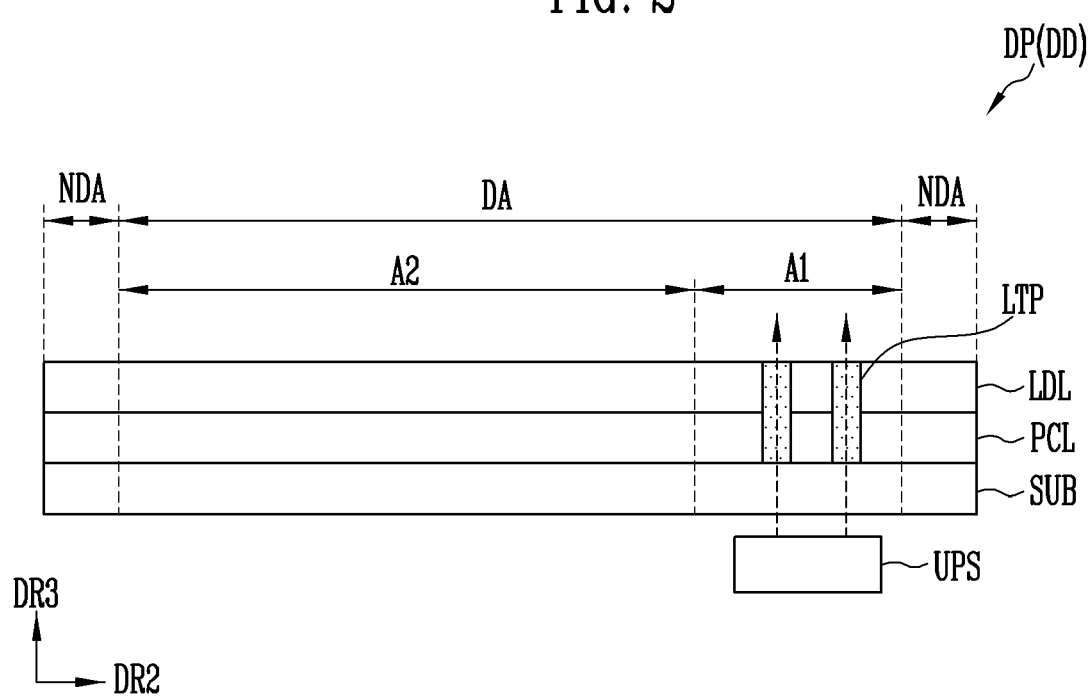
FIG. 2 is a cross-sectional view illustrating an example of the display device of FIG. 1 according to some example embodiments.

FIG. 2 is a cross-sectional view illustrating one example of the display device of FIG. 1. In FIG. 2, a display panel DP provided in a display device DD is illustrated.

Referring to FIG. 2, the display panel DP may include a substrate SUB (or a base layer), a pixel circuit layer PCL, and a light-emitting element layer LDL.

The pixel circuit layer PCL on the substrate SUB, may include a plurality of insulating layers, transistors formed between the plurality of insulating layers, and lines coupled to the transistors.

The light-emitting element layer LDL, located on the pixel circuit layer PCL, may include light-emitting elements.

A sensor UPS may be located below the substrate SUB. As illustrated in FIG. 2, the sensor UPS may be located below the first area A1 of the substrate SUB.

According to some example embodiments, the sensor UPS may be an optical sensor. The sensor UPS may include, for example, a fingerprint sensor, an image sensor, a camera, a strobe, an optical sensor, an illuminance sensor, a proximity sensor, an RGB sensor, an infrared sensor, and the like. However, the sensor UPS is not limited to these examples. For example, the sensor UPS may include various sensors, such as an ultrasonic sensor, a microphone, an environmental sensor (e.g., a barometer, a hygrometer, a thermometer, a radioactivity sensor, a heat sensor, and the like), a chemical sensor (e.g., a gas sensor, a dust sensor, a smell sensor, and the like), and the like.

According to some example embodiments, the display panel DP may include an optical path LTP (or a light transmission path) formed throughout the pixel circuit layer PCL and the light-emitting element layer LDL. In the optical path LTP, only a plurality of insulating layers are provided, and conductive elements (e.g., a line, an electrode of a transistor, a conductive pattern, an electrode of a light-emitting element, and the like) may not be located therein.

Also, a material having a high light transmittance may be further located in the optical path LTP.

According to some example embodiments, a material having a refractive index that is different from the refractive index of the insulating layers may be located in the optical path LTP. For example, a transparent organic layer having a higher refractive index than the insulating layers may be located in the optical path LTP. In this case, light (or a signal) emitted from the sensor UPS and travelling in a third direction DR3 is totally reflected between the transparent organic layer and the insulating layers (that is, in the edge of the optical path LTP), and the amount of light emitted from the sensor UPS or received by the sensor UPS is increased, whereby the sensitivity of the sensor UPS may be improved.

According to some example embodiments, the transparent organic layer provided in the optical path LTP may be formed of a single layer including acryl resin, epoxy resin, phenolic resin, polyamide resin, polyimide resin, and the like, and may have, for example, a refractive index ranging from 1.5 to 1.7.

Figure 3:
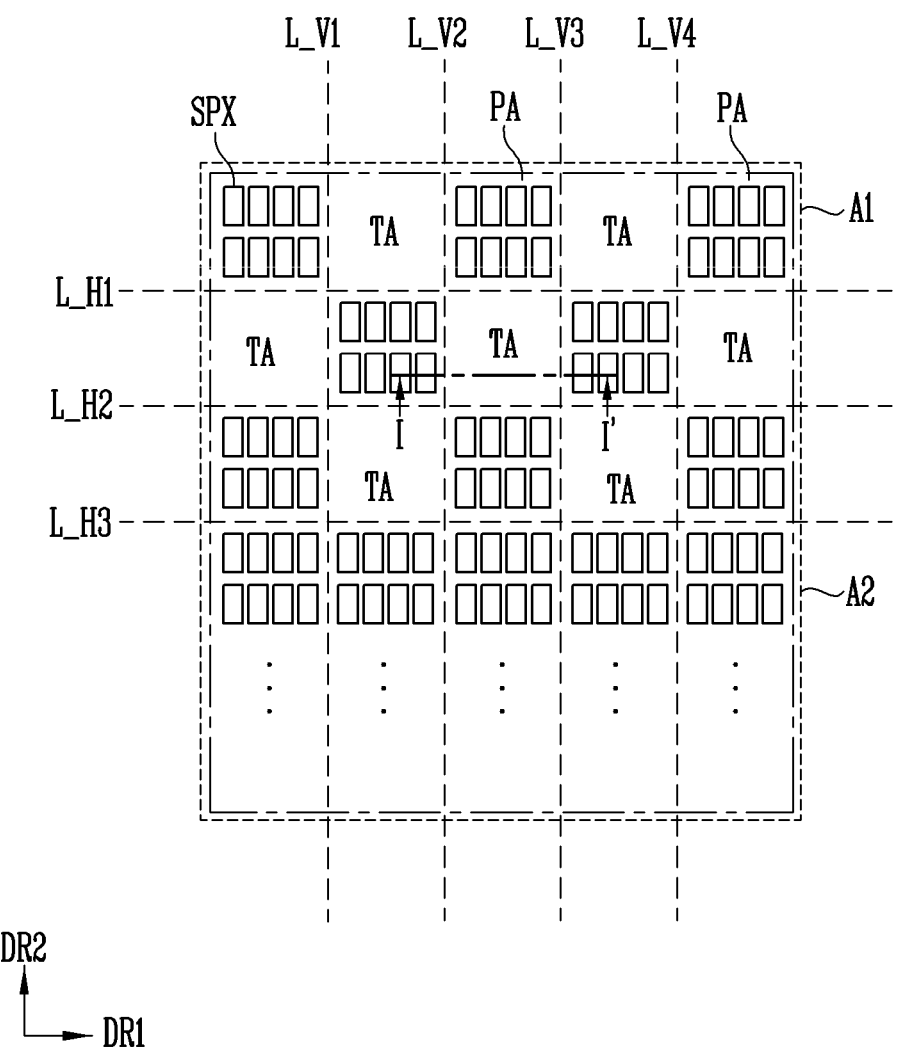
FIG. 3 is an enlarged view of the area Q of FIG. 1.

FIG. 3 is an enlarged view of the area Q of FIG. 1.

Referring to FIG. 3, a first area A1 may include pixel areas PA (or emission areas) and transmissive areas TA, and a second area A2 may include only pixel areas PA. Here, subpixels SPX may be provided in the pixel areas PA, and the subpixels SPX may not be provided in the transmissive areas TA. The respective subpixels SPX may be the same as the pixels PXL1 and PXL2 described with reference to FIG. 1, but without limitation thereto, two or more subpixels SPX may be included in each of the pixels PXL1 and PXL2.

In the first area A1, the pixel areas PA have a grid shape, and may be arranged so as to be spaced apart from each other. For example, first reference lines L_H1, L_H2 and L_H3 extending in a first direction DR1 are arranged so as to be spaced apart from each other along a second direction DR2, second reference lines L_V1, L_V2, L_V3 and L_V4 extending in the second direction DR2 are arranged so as to be spaced apart from each other along the first direction DR1, and the pixel areas PA and the transmissive areas TA may be alternately located in the areas divided by the first reference lines L_H1, L_H2 and L_H3 and the second reference lines L_V1, L_V2, L_V3 and L_V4.

In the second area A2, the pixel areas PA may be located so as to be adjacent to each other. Accordingly, the density of the pixel areas PA (or the subpixels SPX) in the first area A1 is lower than the density of the pixel areas PA (or the subpixels SPX) in the second area A2, and for example, the density of the pixel areas PA in the first area A1 may be ½ of the density of the pixel area PA in the second area A2.

However, the density is not limited to this example, and for example, the density of the pixel areas PA in the first area A1 may be ¼ of the density of the pixel areas PA in the second area A2, in which case the pixel areas PA in the first area A1 are arranged in the form of islands and each of the pixel areas PA may be surrounded by the transmissive areas TA.

Figure 4:
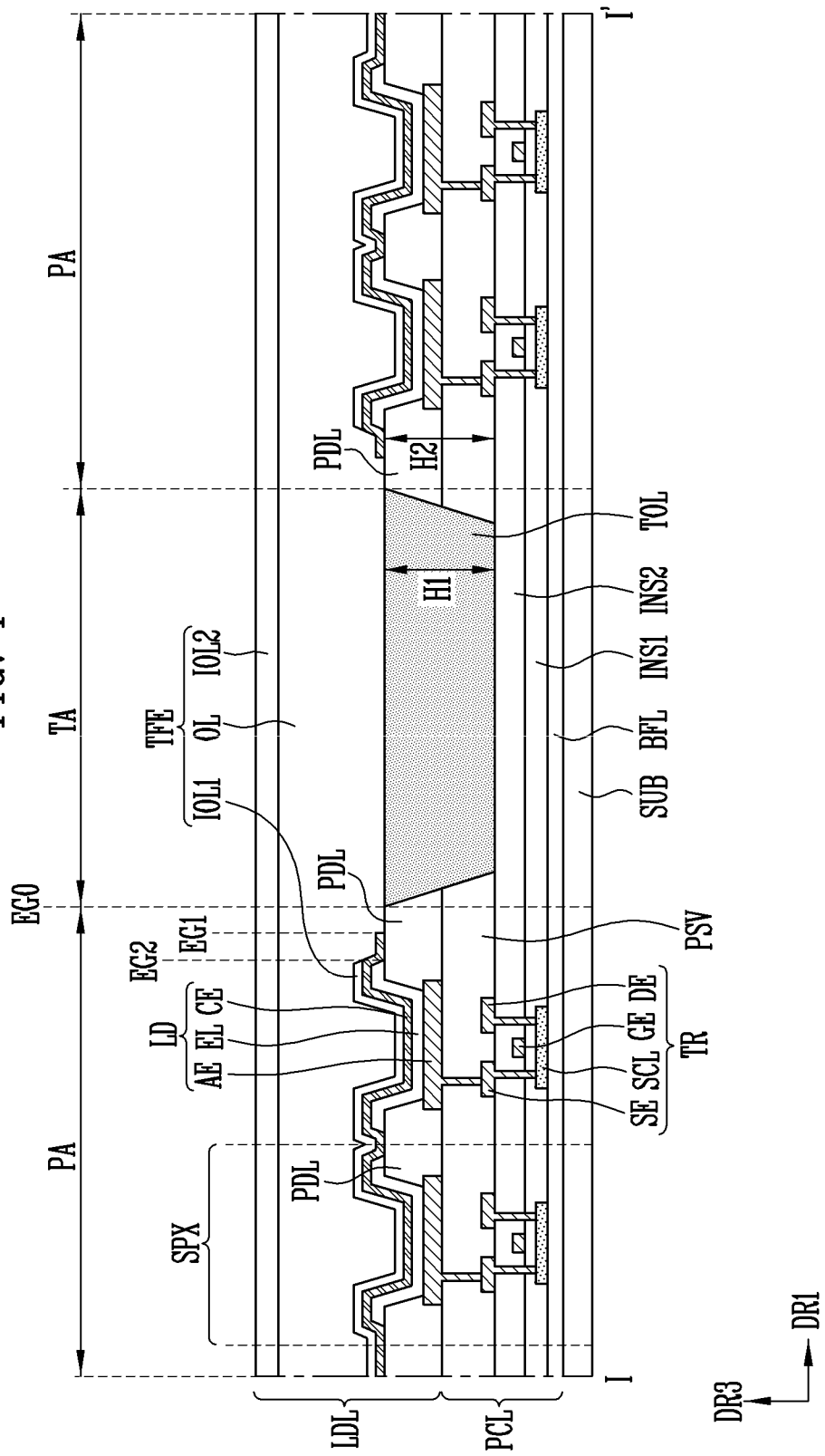
FIG. 4 is a cross-sectional view illustrating an example of a display device, taken along the line I-I' of FIG. 3.

FIG. 4 is a cross-sectional view illustrating an example of a display device, taken along the line I-I' of FIG. 3.

Referring to FIGS. 2 to 4, a pixel circuit layer PCL may include a buffer layer BFL, a semiconductor layer, a first insulating layer INS1, a first conductive layer, a second insulating layer INS2, a second conductive layer, and a protective layer PSV. In a pixel area PA, the buffer layer BFL, the semiconductor layer, the first insulating layer INS1, the first conductive layer, the second insulating layer INS2, the second conductive layer, and the protective layer PSV may be sequentially stacked on a substrate SUB (or a base layer), as illustrated in FIG. 4.

The buffer layer BFL may be formed or arranged on the entire surface of the substrate SUB. The buffer layer BFL may prevent impurity ions from diffusing, prevent or reduce instances of moisture or external air or contaminants penetrating, and perform a surface-flattening function. The buffer layer BFL may include silicon nitride, silicon oxide, silicon oxynitride, and the like. The buffer layer BFL may be omitted depending on the type of substrate SUB, a manufacturing condition, or the like.

The semiconductor layer may be located on the buffer layer BFL (or the substrate SUB), and may include a semiconductor pattern SCL. The semiconductor layer may be an active layer that configures the channel of a transistor TR. The semiconductor layer may include a source region and a drain region that are in contact with a first transistor electrode (or a source electrode) and a second transistor electrode (or a drain electrode), which will be described later. The region between the source region and the drain region may be a channel region.

The semiconductor layer may include an oxide semiconductor. The channel region of the semiconductor pattern is a semiconductor pattern that is not doped with impurities, and may be an intrinsic semiconductor. The source region and the drain region may be a semiconductor pattern doped with impurities. For example, n-type impurities may be used as the impurities.

The first insulating layer INS1 (or a gate insulating layer) may be located on the semiconductor layer and the buffer layer BFL (or the substrate SUB). The first insulating layer INS1 may be generally formed throughout the entire surface of the substrate SUB. The first insulating layer INS1 may be a gate insulating layer having a gate-insulating function.

The first insulating layer INS1 may include an inorganic insulation material, such as a silicon compound, metallic oxide, and the like. For example, the first insulating layer INS1 may include silicon oxide, silicon nitride, silicon oxynitride, aluminum oxide, tantalum oxide, hafnium oxide, zirconium oxide, titanium oxide, or a combination thereof. The first insulating layer INS1 may have a single-layer structure or a multi-layer structure including stacked layers of different materials.

The first conductive layer may be located on the first insulating layer INS1. The first conductive layer may include a gate electrode GE (or a first conductive pattern). Also, the first conductive layer may further include lines coupled to the gate electrode GE of the transistor or configuring the gate electrode GE (e.g., a scan line and a gate line), capacitor electrodes, and the like.

The gate electrode GE is arranged so as to overlap the semiconductor pattern SCL, and may configure the gate electrode of the transistor TR.

The first conductive layer may include one or more types of metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first conductive layer may have a single-layer structure or a multi-layer structure.

The second insulating layer INS2 (or an interlayer insulating layer) may be formed on the first conductive layer, and may be generally located throughout the entire surface of the substrate SUB. The second insulating layer INS2 functions to insulate the first conductive layer from the second conductive layer, and may be an interlayer insulating layer.

The second insulating layer INS2 may include an inorganic insulation material, such as silicon oxide, silicon nitride, silicon oxynitride, hafnium oxide, aluminum oxide, titanium oxide, tantalum oxide, zinc oxide, or the like, or an organic insulation material, such as polyacrylates resin, epoxy resin, phenolic resin, polyamides resin, polyimides resin, unsaturated polyesters resin, poly phenylenethers resin, polyphenylenesulfides resin, benzocyclobutene (BCB), or the like. The second insulating layer INS2 may have a single-layer structure or a multi-layer structure including stacked layers of different materials.

The second conductive layer may be located on the second insulating layer INS2. The second conductive layer may include the first transistor electrode SE (or the second conductive pattern) and the second transistor electrode DE (or the third conducive pattern). Also, the second conductive layer may further include lines coupled to at least one of the first transistor electrode SE, the second transistor electrode DE (e.g., a data line), or power lines.

The first transistor electrode SE overlaps a partial area of the semiconductor pattern SCL (e.g., the source region of the transistor TR), and may come in contact with a partial area of the semiconductor pattern SCL exposed through a contact hole. The first transistor electrode SE may configure the first electrode (e.g., the source electrode) of the transistor TR.

Similarly, the second transistor electrode DE overlaps a partial area of the semiconductor pattern SCL (e.g., the drain region of the transistor TR), and may come in contact with a partial area of the semiconductor pattern SCL exposed through a contact hole. The second transistor electrode DE may configure the second electrode (e.g., the drain electrode) of the transistor TR.

Similar to the first conductive layer, the second conductive layer may include one or more types of metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer may have a single-layer structure or a multi-layer structure.

The protective layer PSV (or the third insulating layer) may be located on the second conductive layer. The protective layer PSV provides a planation surface, and the protective layer PSV including an organic insulating layer, an inorganic insulating layer, or an organic insulating layer located on an inorganic insulating layer may be provided.

A contact hole through which the first transistor electrode SE is exposed is formed in the protective layer PSV, and the first transistor electrode SE may be coupled to the second electrode AE of a light-emitting element layer LDL through the contact hole.

According to some example embodiments, in the transmissive area TA, the pixel circuit layer PCL may include only the buffer layer BFL, the first insulating layer INS1, and the second insulating layer INS2 that are sequentially arranged on the substrate SUB. That is, in the transmissive area TA, the semiconductor pattern of the semiconductor layer, the conductive pattern of the first conductive layer, and the conductive pattern of the second conductive layer may not be included in the pixel circuit layer PCL.

According to some example embodiments, in the transmissive area TA, the pixel circuit layer PCL may include a groove that is formed by penetrating through at least one of a plurality of insulating layers. In the transmissive area TA, the protective layer PSV may include a groove configured to expose the second insulating layer INS2, as illustrated in FIG. 4.

The light-emitting element layer LDL is located on the protective layer PSV, and the light-emitting element layer LDL may include a pixel defining layer PDL and a light-emitting element LD provided in the pixel area PA. Also, the light-emitting element layer LDL may further include a transparent organic layer TOL provided in the transmissive area TA. The transmissive area TA may be defined by the transparent organic layer TOL. For example, the transmissive area TA is an area in which the transparent organic layer TOL is provided, and the edge thereof may coincide with the edge of the upper surface of the transparent organic layer TOL. Further, the light-emitting element layer LDL may further include a first inorganic layer IOL1 (or a first inorganic encapsulation layer) provided in the pixel area PA, an organic layer OL (or an organic encapsulation layer) provided on the entire surface of the substrate SUB, and a second inorganic layer IOL2 (or a second inorganic encapsulation layer). Here, the first inorganic layer IOL1, the organic layer OL, and the second inorganic layer IOL2 may configure a thin-film encapsulation layer TFE configured to protect the light-emitting element LD from external moisture, foreign materials, and the like.

Hereinafter, the light-emitting element layer LDL in the pixel area PA will be described first, and then the light-emitting element layer LDL in the transmissive area TA will be described.

The second electrode AE may be located on the protective layer PSV. The second electrode AE may be coupled to the first transistor electrode SE through a through-hole (e.g., a via hole) that penetrates through the protective layer PSV.

The pixel defining layer PDL includes an opening, and the opening may define a light-emitting area of each of the subpixels SPX. The opening of the pixel defining layer PDL may expose at least a portion of the second electrode AE. The pixel defining layer PDL may include an organic material.

The light-emitting element LD may include the second electrode AE, an emission layer EL located on the second electrode AE, and a first electrode CE located on the emission layer EL. For example, the light-emitting element LD may be an organic light-emitting diode.

One of the second electrode AE and the first electrode CE may be an anode electrode, and the other one may be a cathode electrode. For example, the second electrode AE may be an anode electrode, and the first electrode CE may be a cathode electrode. The second electrode AE may be a reflective electrode, and the first electrode CE may be a transmissive electrode.

The second electrode AE may include a reflective layer capable of reflecting light and a transparent conductive layer located above or below the reflective layer. At least one of the transparent conductive layer or the reflective layer may be in contact with the first transistor electrode SE.

The reflective layer may include a material capable of reflecting light. For example, the reflective layer may include at least one of aluminum (Al), silver (Ag), chromium (Cr), molybdenum (Mo), platinum (Pt), nickel (Ni), or an alloy thereof.

The transparent conductive layer may include transparent conductive oxide. For example, the transparent conductive layer may include at least one type of transparent conductive oxide, among Indium Tin Oxide (ITO), Indium Zinc Oxide (IZO), Aluminum Zinc Oxide (AZO), Gallium-doped Zinc Oxide (GZO), Zinc Tin Oxide (ZTO), Gallium Tin Oxide (GTO), and Fluorine-doped Tin Oxide (FTO).

The emission layer EL may be located on the exposed surface of the second electrode AE. The emission layer EL may have a multi-layer thin-film structure including at least a light generation layer. For example, the emission layer EL may include a hole injection layer configured to inject a hole, a hole transport layer having excellent hole-transportability and for increasing the probability of recombination of holes and electrons by impeding the movement of the electrons that are not combined in the light generation layer, the light generation layer configured to emit light through the recombination of the injected electrons and holes, a hole blocking layer for impeding the movement of holes that are not combined in the light generation layer, an electron transport layer for smoothly transporting electrons to the light generation layer, and an electron injection layer for injecting electrons.

The color of light generated in the light generation layer may be one of red, green, blue and white, but is not limited thereto. For example, the color of light generated in the light generation layer of the emission layer EL may be one of magenta, cyan and yellow.

The first electrode CE may be located on the emission layer EL. The first electrode CE may be a transflective layer. For example, the first electrode CE may be a thin metal layer having a thickness sufficient to transmit light. The first electrode CE may transmit portion of light generated in the light generation layer and reflect the remainder thereof.

The first electrode CE may include a material having a low work function, compared to a transparent conductive layer. For example, the first electrode CE may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof.

Portion of light emitted from the emission layer EL may not transmit the first electrode CE, and light reflected from the first electrode CE may be again reflected from the reflective layer. That is, light emitted from the emission layer EL may resonate between the reflective layer and the first electrode CE. The light extraction efficiency of an OLED may be improved by resonation of light.

The distance between the reflective layer and the first electrode CE may be different depending on the color of light generated in the light generation layer. That is, depending on the color of light generated in the light generation layer, the distance between the reflective layer and the first electrode CE may be adjusted so as to match the resonance distance.

According to some example embodiments, the first electrode CE does not overlap the transmissive area TA (or the transparent organic layer TOL), and may be spaced apart from the transmissive area TA (or the transparent organic layer TOL) in a plan view (or when viewed form a top plan view)

Figure 5:
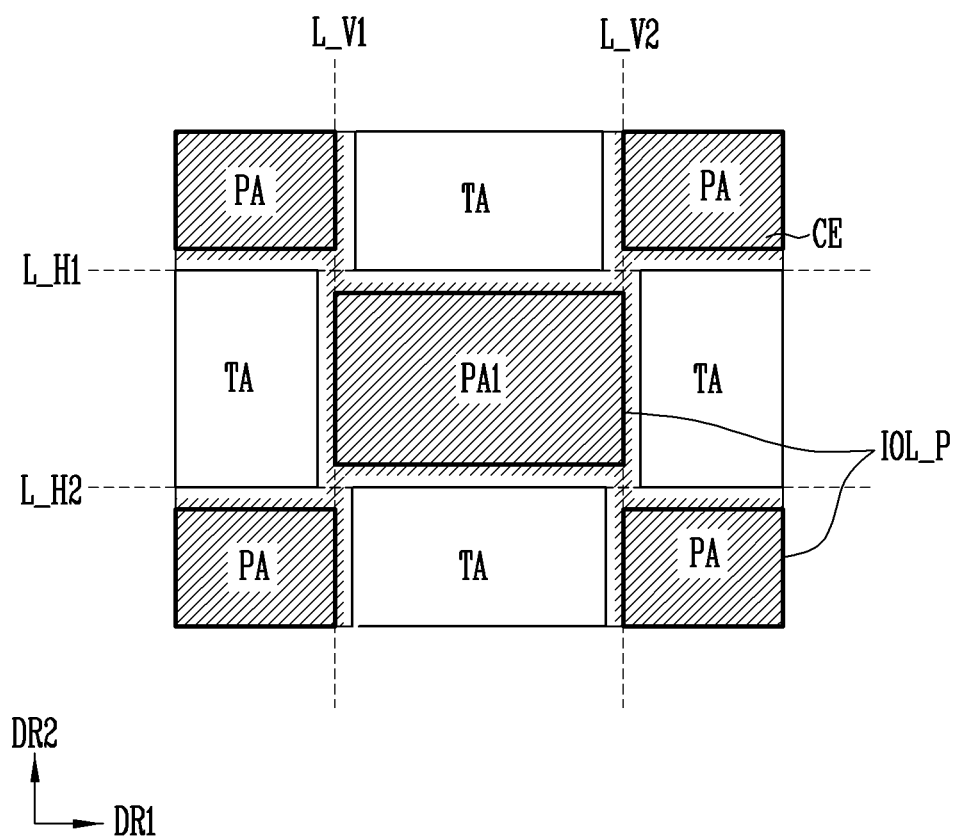
FIG. 5 is a plan view illustrating an example of a first electrode included in the display device of FIG. 4.

In order to explain the arrangement of the first electrode CE viewed from the top plan view, FIG. 5 may be referred to.

FIG. 5 is a plan view illustrating an example of the first electrode included in the display device of FIG. 4.

Referring to FIG. 5, the first electrode CE may be continuously formed on the pixel areas PA.

For example, the first electrode CE may be located on the first pixel area PA1, may extend in the second direction DR2 between the transmissive areas TA along the edge of the transmissive areas TA, and may be continuously formed on the pixel areas PA adjacent to the first pixel area PA1.

As will be illustrated later, because the first electrode CE is formed through a single process (e.g., a single chemical deposition process), the first electrode CE may have a uniform thickness throughout the entire pixel areas PA (and the connection parts between the pixel areas PA).

According to some example embodiments, the distance by which the first electrode is spaced apart from the edge of the transmissive areas TA (that is, the transparent organic layer TOL) may be constant. In order to reduce the total resistance of the first electrode CE while maximizing the area of the transmissive area TA, the first electrode CE may be spaced a fixed distance apart from the edge of the transmissive areas TA.

According to some example embodiments, each of the sides of the first electrode CE facing the transmissive areas TA may be a straight line. For example, one side of the first electrode CE located in the first direction DR1 based on the first pixel area PA1 may be parallel to the second vertical reference line L_V2. For example, another side of the first electrode CE located in the second direction DR2 based on the first pixel area PA1 may be parallel to the first horizontal reference line L_H1.

Meanwhile, although the transmissive area TA is illustrated as having a flat rectangular shape and the first electrode CE is illustrated as having sides of straight lines in FIG. 5, they are not limited thereto. For example, when the transmissive area TA has a flat circular shape, the first electrode CE may be spaced a uniform distance apart from the transmissive area TA, and may have flat circular sides (or holes) corresponding to the transmissive area TA. In another example, when the transmissive area TA has a flat polygonal shape, the first electrode CE may be spaced a uniform distance apart from the transmissive area TA, and may have sides (or holes) of a flat polygonal shape corresponding to the transmissive area TA.

Referring again to FIG. 4, the first inorganic layer IOL1 may be located on the first electrode CE.

The first inorganic layer IOL1 may be made of an inorganic insulation material, such as polysiloxane, silicon nitride, silicon oxide, silicon oxynitride, or the like.

According to some example embodiments, the first inorganic layer IOL1 does not overlap the transmissive area TA (or the transparent organic layer TOL), and may be spaced apart from the transmissive area TA (or the transparent organic layer TOL) in a plan view.

According to some example embodiments, the second edge EG2 of the first inorganic layer IOL1 may be spaced further apart from the transmissive area TA (or the transparent organic layer TOL) than the first edge EG1 of the first electrode CE. In other words, the first edge EG1 of the first electrode CE may be closer to the transmissive area TA (or the transparent organic layer TOL) than the second edge EG2 of the first inorganic layer IOL1. By the first inorganic layer IOL1, the edge part of the first electrode CE may be exposed.

According to some example embodiments, the distance between the first edge EG1 of the first electrode CE and the second edge EG2 of the first inorganic layer IOL1 (e.g., the distance in the first direction DR1) may be equal or similar to the thickness of the first electrode CE (e.g., the thickness in the third direction DR3).

The relationship between the arrangement of the first edge EG1 of the first electrode CE and that of the second edge EG2 of the first inorganic layer IOL1 will be described later with reference to FIGS. 6A to 6J.

According to some example embodiments, the first inorganic layer IOL1 may be individually arranged in each of the pixel areas PA.

Referring to FIG. 5, the first inorganic layer IOL1 includes inorganic patterns IOL_P that are separated from each other, and the inorganic patterns IOL_P may be arranged on the respective pixel areas.

According to some example embodiments, the distance by which the second edge of the first inorganic layer IOL1 (or the inorganic patterns IOL_P) is spaced apart from the first edge of the first electrode CE may be constant. Also, when the sides of the first electrode CE are straight lines, the sides of the first inorganic layer IOL1 may also be straight lines.

Referring again to FIG. 4, the organic layer OL and the second inorganic layer IOL2 may be sequentially arranged on the first inorganic layer IOL1. Because the edge part of the first electrode CE is exposed by the first inorganic layer IOL1, the edge part of the first electrode CE may be in contact with the organic layer OL.

The organic layer OL may be made of an organic insulation material, such as a polyacrylic compound, a polyimide compound, a fluorocarbon compound such as Teflon, a benzocyclobutene compound, or the like, and the second inorganic layer IOL2 may be made of an inorganic insulation material, such as polysiloxane, silicon nitride, silicon oxide, silicon oxynitride, or the like, similar to the first inorganic layer IOL1.

Meanwhile, in the transmissive area TA, the pixel defining layer PDL may include a hole that exposes the second insulating layer INS2 (or the protective layer PSV). The hole of the pixel defining layer PDL may overlap the hole of the protective layer PSV.

In the transmissive area TA, the hole of the protective layer PSV and the hole of the pixel defining layer PDL may be filled with the transparent organic layer TOL.

As described with reference to FIG. 2, the transparent organic layer TOL may be formed of a single layer including acryl resin, epoxy resin, phenolic resin, polyamide resin, polyimide resin, and the like, and the transparent organic layer TOL may have a refractive index ranging from 1.5 to 1.7.

According to some example embodiments, with respect to the substrate SUB, the height of the upper surface of the transparent organic layer TOL may be equal to the height of the pixel defining layer PDL.

As illustrated in FIG. 4, the thickness H1 of the transparent organic layer TOL may be equal to the total thickness H2 of the protective layer PSV and the pixel defining layer PDL. However, the thickness is not limited to this example, and the thickness H1 of the transparent organic layer TOL may be less or greater than the total thickness H2 of the protective layer PSV and the pixel defining layer PDL.

In the transmissive area TA, the organic layer OL is located directly on the transparent organic layer TOL, and the second inorganic layer IOL2 may be located on the organic layer OL.

That is, in the transmissive area TA, the light-emitting element layer LDL includes only the transparent organic layer TOL, the organic layer OL, and the second inorganic layer IOL2, which are sequentially stacked, and the first electrode CE and the first inorganic layer IOL1 may not be included therein. Compared to the case in which the first electrode CE and the first inorganic layer IOL1 are arranged in the transmissive area TA, the transmittance of the transmissive area TA (e.g., the light transmittance) may be improved. Also, the light output efficiency (and the light reception efficiency) of the transmissive area TA may be more improved by the transparent organic layer TOL having a refractive index ranging from 1.5 to 1.7.

FIGS. 6A to 6J are views for explaining a method of manufacturing a display device according to some example embodiments. In FIGS. 6A to 6J, views corresponding to FIG. 4 and FIG. 5 are illustrated.

Referring to FIG. 4 and FIG. 6A, a panel on which a plurality of insulating layers INS1 and INS2 located on a substrate SUB, a protective layer PSV, and a pixel defining layer PDL are formed may be prepared. The panel may include a transistor TR and a second electrode AE formed in pixel areas PA. In the transmissive area TA of the panel, a groove that penetrates through at least one of the plurality of insulating layers INS1 and INS2, the protective layer PSV, or the pixel defining layer PDL may be formed. In the transmissive area TA, the protective layer PSV may include a first hole OP1 (or a first opening) configured to expose the second insulating layer INS2, and the pixel defining layer PDL may include a second hole OP2 (or a second opening) that overlaps the first hole OP1, as illustrated in FIG. 6A.

Then, a dummy pattern MP may be formed on the pixel defining layer PDL.

Figure 6B:
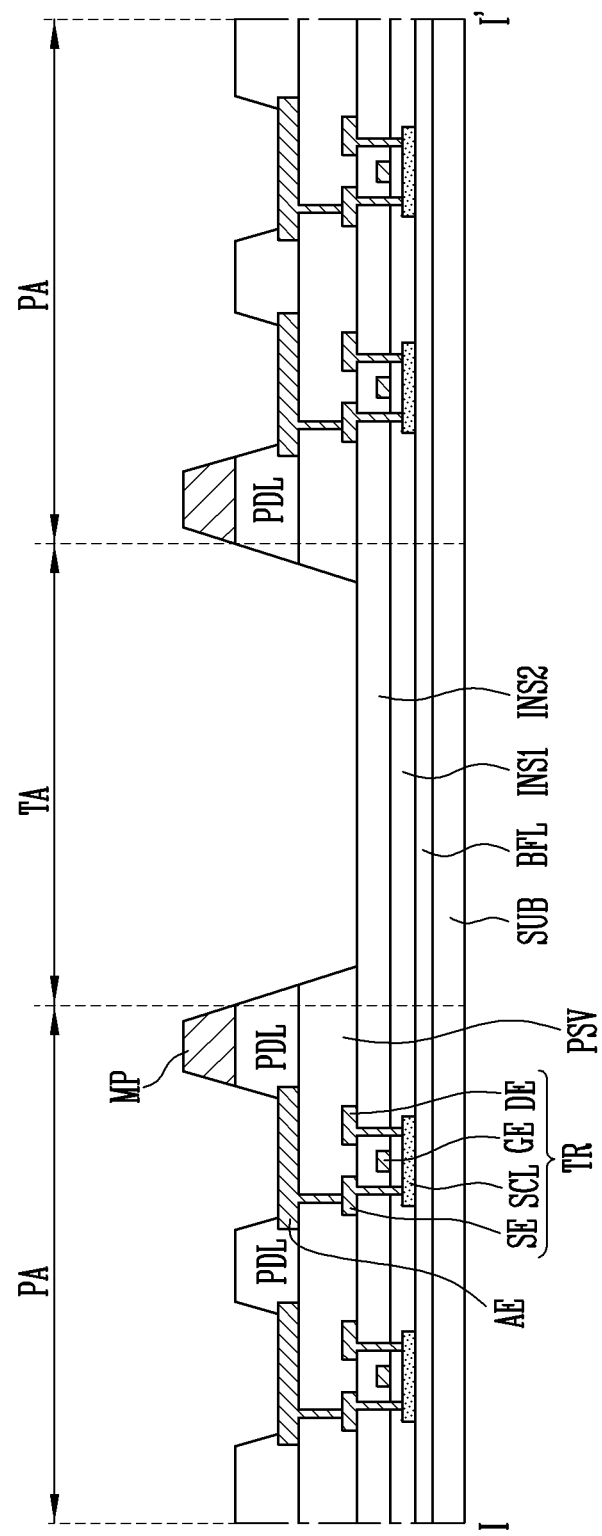
Figure 6C:
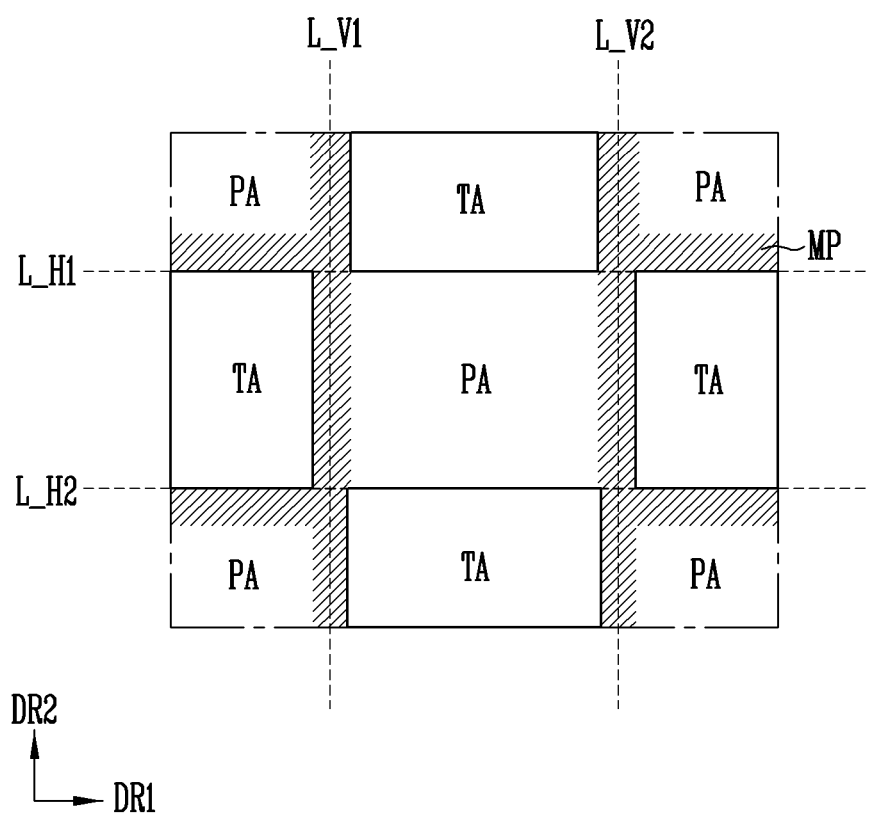

Referring to FIG. 6B and FIG. 6C, along the edge of the transmissive area TA, the dummy pattern MP may be formed on the pixel defining layer PDL within the pixel areas PA. The dummy pattern MP may include transparent conductive oxide. For example, the dummy pattern MP may include at least one of Indium Tin Oxide (ITO), Indium Zinc Oxide (IZO), Aluminum Zinc Oxide (AZO), Gallium-doped Zinc Oxide (GZO), Zinc Tin Oxide (ZTO), Gallium Tin Oxide (GTO), or Fluorine-doped Tin Oxide (FTO). For example, the dummy pattern MP may be formed through wet etching.

As illustrated in FIG. 6C, the dummy pattern MP may have a mesh shape. The dummy pattern MP may generally include first fine lines extending in a first direction DR1 along first reference lines L_H1 and L_H2 and second fine lines extending in a second direction DR2 along second reference lines L_V1 and L_V2. The first fine lines and the second fine lines may have a constant width.

The height of the dummy pattern MP may be variously changed depending on embodiments, but the height of the dummy pattern MP is greater than the total thickness of the first electrode CE and the first inorganic layer IOL1 described with reference to FIG. 4. For example, the height of the dummy pattern MP may be greater than two times the total thickness of the first electrode CE and the first inorganic layer IOL1.

Then, a transparent organic layer TOL may be formed in the transmissive area TA (and the pixel area PA).

Figure 6D:
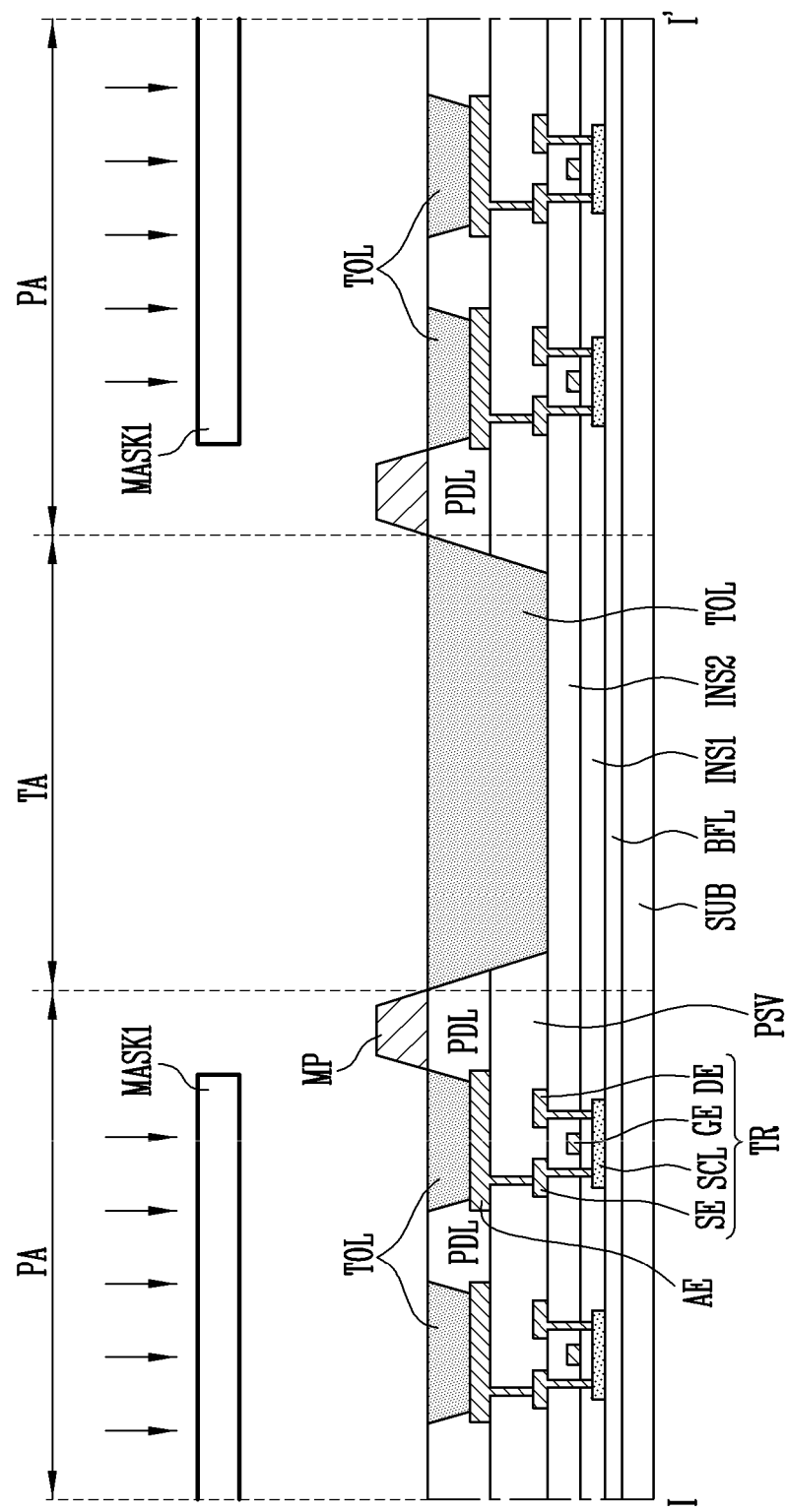

Referring to FIG. 6D, the transparent organic layer TOL may fill the first hole (e.g., OP1 in FIG. 6A) and the second hole (e.g., OP2 in FIG. 6A) within the transmissive area TA. The transparent organic layer TOL that fills the opening of the pixel defining layer PDL (in the pixel area PA) may be eliminated through a light exposure process using a first mask MASK1.

As described with reference to FIG. 4, the height of the transparent organic layer TOL within the transmissive area TA may be equal to the height of the pixel defining layer PDL, but is not limited thereto.

Then, photoresist PR may be formed on the transparent organic layer TOL in the transmissive area TA.

Referring to FIG. 6E, the photoresist PR may be formed on the transparent organic layer TOL through a light exposure process using a second mask MASK2.

The photoresist PR may have a larger area (or a larger surface area) than the transmissive area TA, and may partially overlap the dummy pattern MP. Accordingly, the lateral surface of the photoresist PR (that is, the lateral surface in contact with the dummy pattern MP) may have a cross-section of an inverse-tapered (reversely tapered) shape corresponding to the shape of the lateral surface of the dummy pattern MP.

Also, the photoresist PR may partially cover the upper surface of the dummy pattern MP. Accordingly, the photoresist PR may further include protrusions that protrude in a horizontal direction from the top of the inclined lateral surface.

Figure 6F:
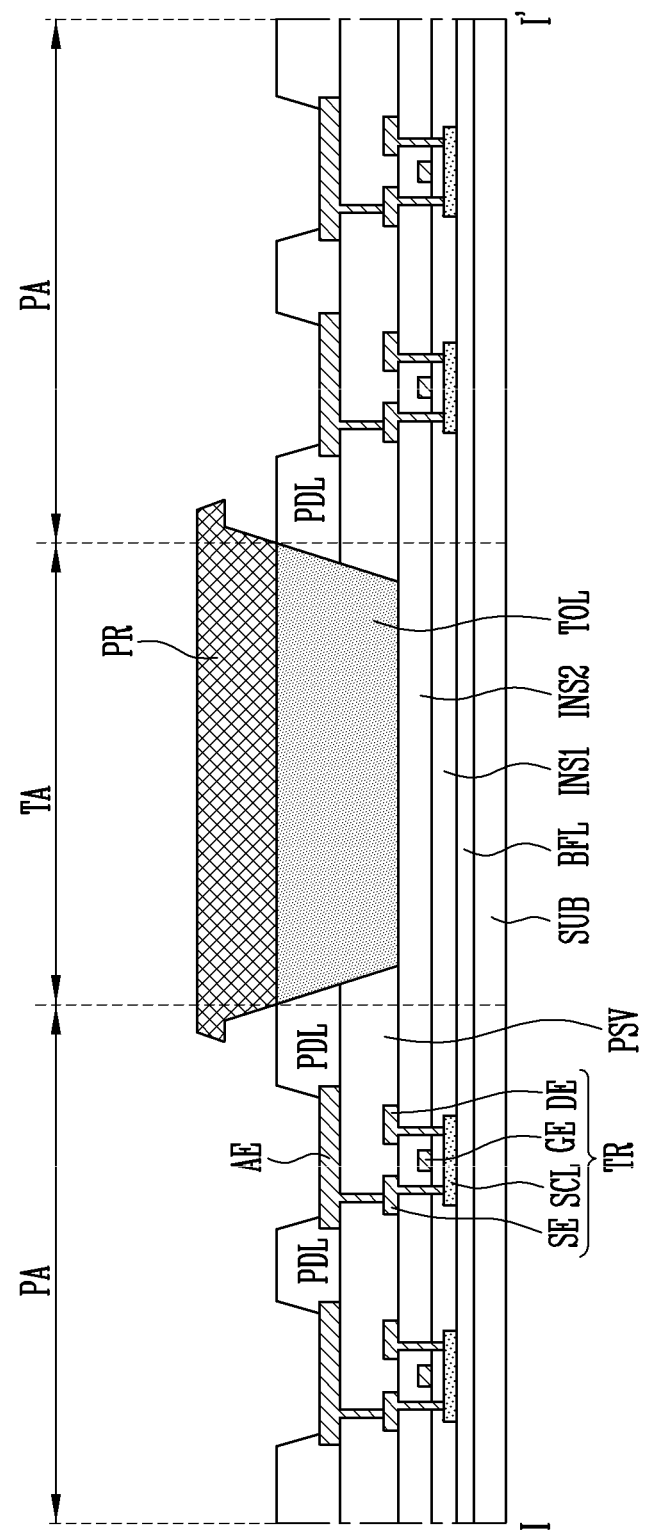

Then, the dummy pattern MP may be eliminated, as illustrated in FIG. 6F. For example, the dummy pattern MP may be eliminated through a wet etching process.

Then, an emission layer EL, a first electrode CE, and a first inorganic layer IOL1 may be sequentially stacked.

Figure 6G:
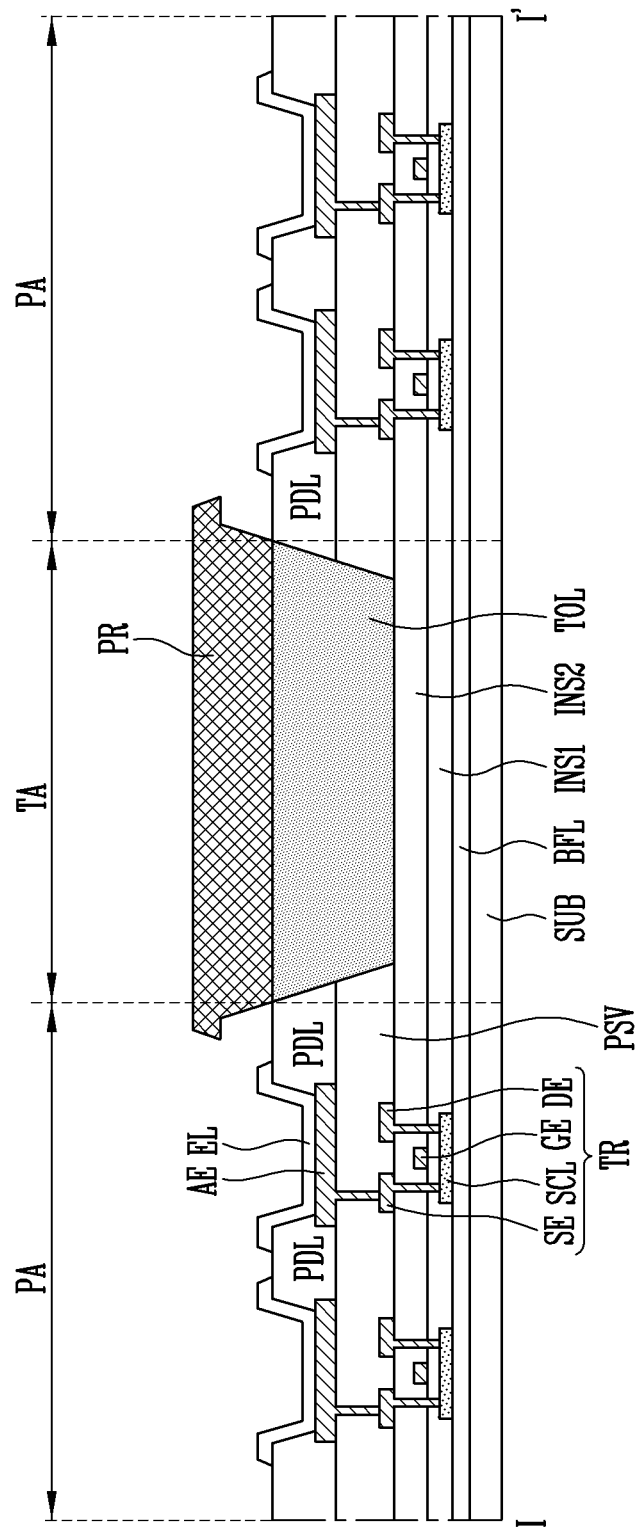

Referring to FIG. 6G, the emission layer EL may be formed in each of the openings of the pixel defining layer PDL. For example, when the pixels emit light with different colors, the emission layer EL may be sequentially formed in the respective openings of the pixel defining layer PDL. According to some example embodiments, when the pixels emit light with the same color, the emission layer EL may be simultaneously formed in the openings of the pixel defining layer PDL.

Referring to FIG. 6H, the first electrode CE may be formed on the entire surface of the substrate SUB. That is, the first electrode CE may be formed so as to cover the emission layer EL within the pixel areas PA and the photoresist PR within the transmissive area TA. The first electrode CE may be formed through a deposition process. By the photoresist PR, the cross-section of which has an inverse-tapered shape, the first electrode CE may be discontinuously formed at the boundary between the transmissive area TA and the pixel areas PA.

Figure 6I:
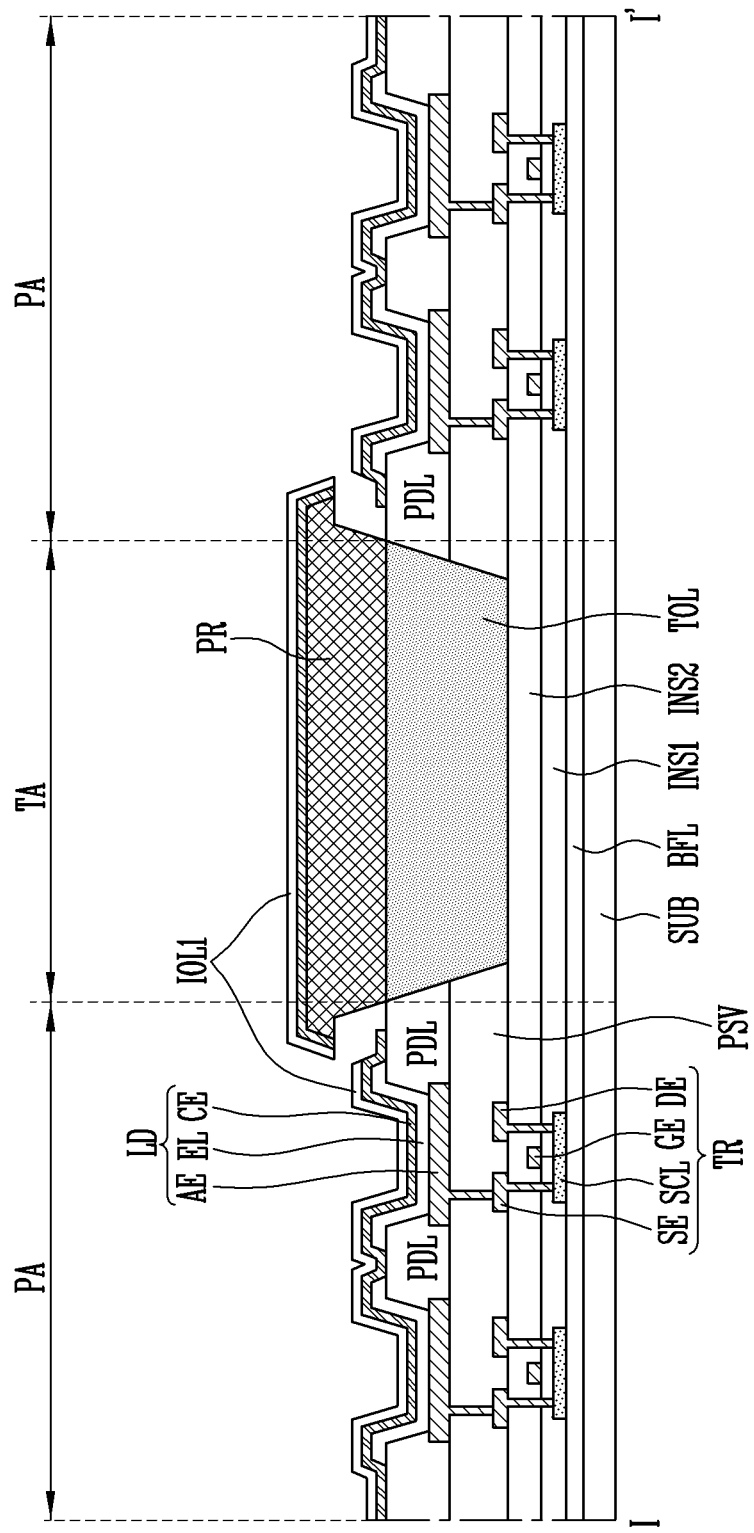

Referring to FIG. 6I, the first inorganic layer IOL1 may be formed on the entire surface of the substrate SUB. The first inorganic layer IOL1 may be formed through a deposition process (e.g., a chemical vapor deposition process). Similar to the first electrode CE, the first inorganic layer IOL1 may be discontinuously formed at the boundary between the transmissive area TA and the pixel areas PA by the photoresist, the cross section of which has an inverse-tapered shape. Because the first electrode CE is formed on the photoresist PR, the edge of the first inorganic layer IOL1 in the pixel areas PA is spaced further apart from the transmissive area TA than the edge of the first electrode CE corresponding thereto, and the distance between the edge of the first electrode CE and the edge of the first inorganic layer IOL1 may be equal or similar to the thickness of the first electrode CE. Accordingly, the edge of the first electrode CE may be exposed by the first inorganic layer IOL1.

Figure 6J:
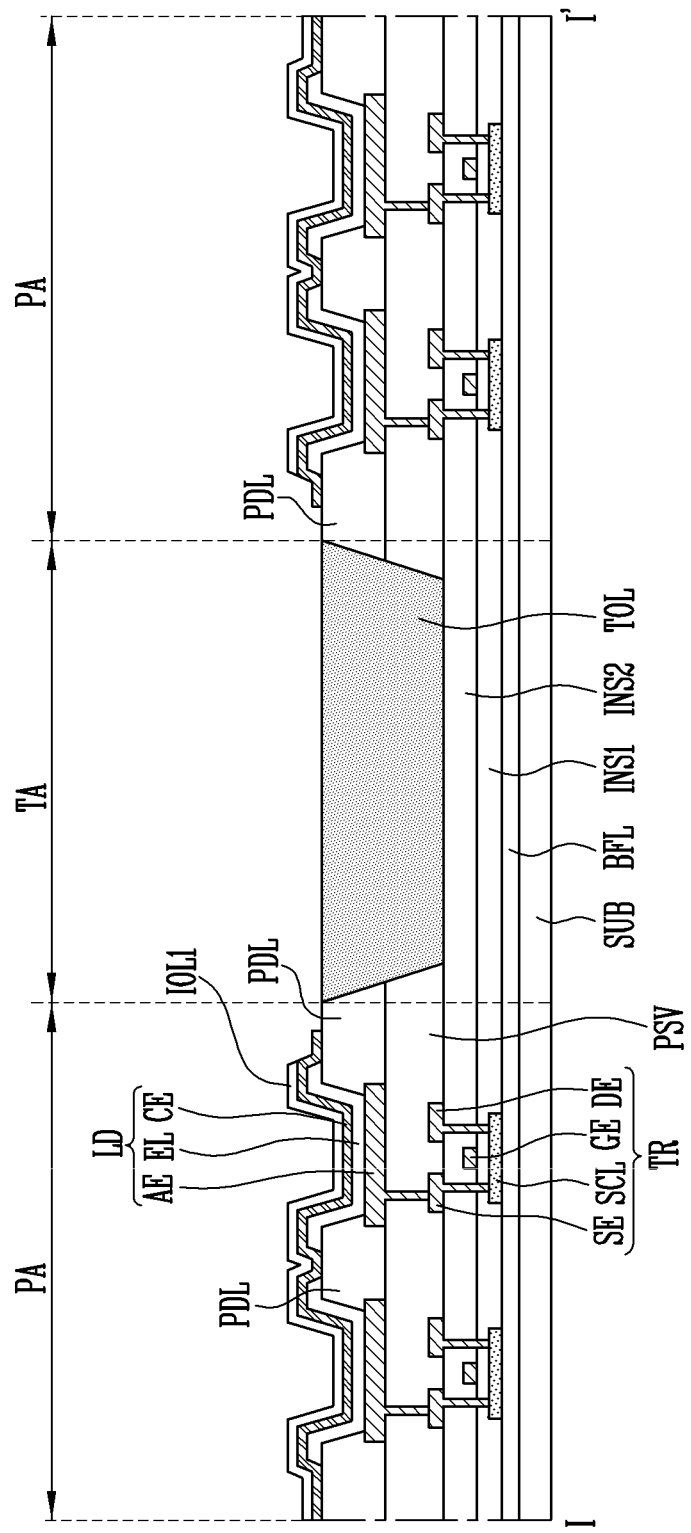

Then, the photoresist PR may be stripped, as illustrated in FIG. 6J. That is, all of the first electrode CE and the first inorganic layer IOL1 stacked on the photoresist PR may be eliminated. Accordingly, the first electrode CE and the first inorganic layer IOL may not be present in the transmissive area TA.

Then, the organic layer OL and the second inorganic layer IOL2 may be sequentially formed on the entire surface of the substrate SUB, as illustrated in FIG. 4.

That is, the organic layer OL configured to cover the transparent organic layer TOL, exposed by stripping the photoresist PR, and the first inorganic layer IOL1 is formed, and the second inorganic layer IOL2 may be formed on the organic layer OL.

As described with reference to FIGS. 6A to 6J, the photoresist PR is formed on the transparent organic layer TOL using the dummy pattern MP, and the photoresist PR may be stripped after the first electrode CE and the first inorganic layer IOL1 are formed. Accordingly, the first electrode CE and the first inorganic layer IOL1 are not present in the transmissive area TA, whereby the transmittance of the transmissive area TA may be more improved.

Meanwhile, because the first electrode CE and the first inorganic layer IOL1 are discontinuously formed due to the photoresist PR, the edge (or the lateral surface) of the first electrode CE and the edge of the first inorganic layer IOL1, corresponding to the edge of the photoresist PR, may be clearly visible.

Figure 7A:
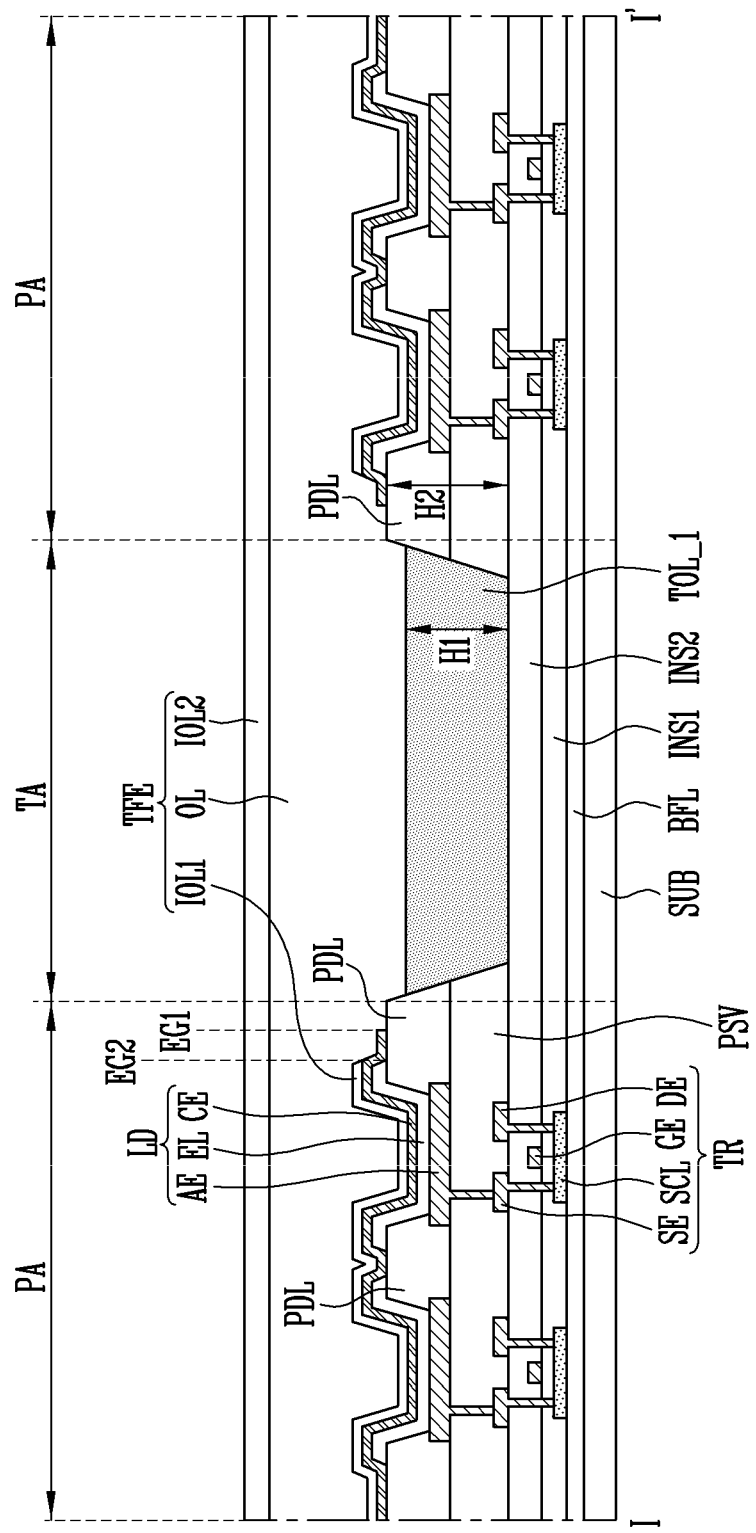

FIG. 7A and FIG. 7B are cross-sectional views illustrating another example of a display device, taken along the line I-I' of FIG. 3. In FIG. 7A and FIG. 7B, views corresponding to FIG. 4 are illustrated.

Referring to FIG. 4, FIG. 7A and FIG. 7B, the display device of FIG. 7A and the display device of FIG. 7B may be same as or similar to the display device of FIG. 4, except for transparent organic layers TOL_1 and TOL_2. Therefore, a repeated description will be omitted.

As illustrated in FIG. 7A, the thickness H1 of the transparent organic layer TOL_1 may be less than the total thickness H2 of the protective layer PSV and the pixel defining layer PDL. That is, with respect to the substrate SUB, the height of the upper surface of the transparent organic layer TOL_1 may be lower than the height of the pixel defining layer PDL.

In this case, the photoresist PR described with reference to FIG. 6E is formed also in the second opening of the pixel defining layer PDL (that is, the second opening formed in the transmissive area TA), and the lateral surface (or the lateral surface of the lower part) of the photoresist PR may have a shape corresponding to the lateral surface of the pixel defining layer PDL. That is, the photoresist PR, the lateral surface of which has an inverse-tapered shape, may be more easily formed.

As illustrated in FIG. 7B, the thickness H1 of the transparent organic layer TOL_2 may be greater than the total thickness H2 of the protective layer PSV and the pixel defining layer PDL. That is, with respect to the substrate SUB, the height of the upper surface of the transparent organic layer TOL_2 may be higher than the height of the pixel defining layer PDL.

In this case, the photoresist PR (or the lower surface of the photoresist PR) described with reference to FIG. 6E is formed further up the first electrode CE and/or the first inorganic layer IOL1, and the photoresist PR may be more easily stripped in the process of stripping the photoresist PR.

FIG. 8A is a cross-sectional view illustrating yet another example of a display device, taken along the line I-I' of FIG. 3. In FIG. 8A, a view corresponding to FIG. 4 is illustrated.

Referring to FIG. 4 and FIG. 8A, the display device of FIG. 8A is the same as or similar to the display device of FIG. 4, except for a first electrode CE_1 and a first inorganic layer IOL1_1. Therefore, a repeated description will be omitted.

As illustrated in FIG. 8A, the first edge EG1_1 of the first electrode CE_1 may coincide with the boundary between the transmissive area TA and the pixel areas PA (or the edge of the transparent organic layer TOL). The second edge EG2_1 of the first inorganic layer IOL1_1 does not overlap the transparent organic layer TOL, and may be spaced apart from the transparent organic layer TOL.

As described with reference to FIG. 4, the distance between the first edge EG1_1 of the first electrode CE_1 and the second edge EG2_1 of the first inorganic layer IOL1_1 may be equal or similar to the thickness of the first electrode CE_1.

Figure 8B:
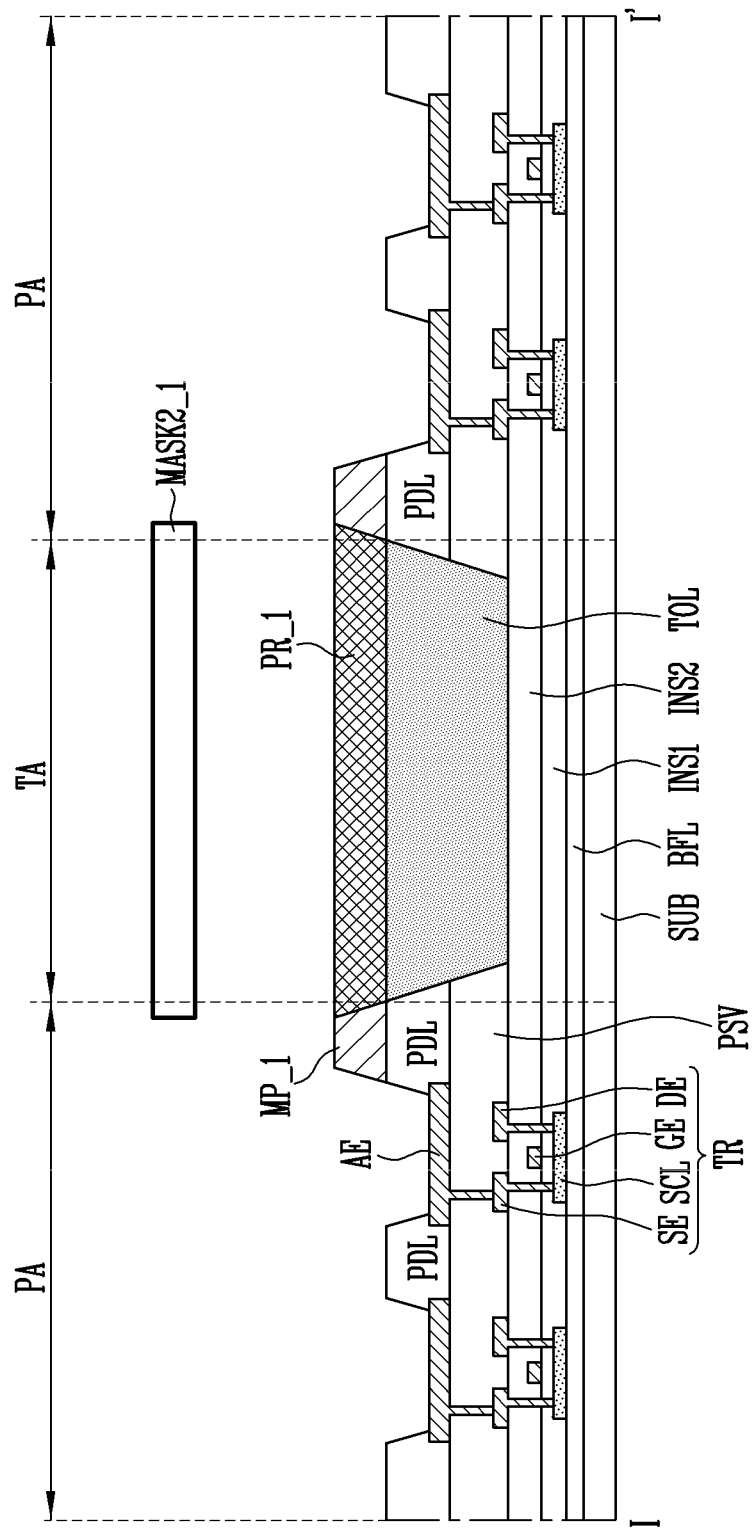
FIG. 8B and FIG. 8C are views for explaining the method of manufacturing the display device of FIG. 8A.
Figure 8C:
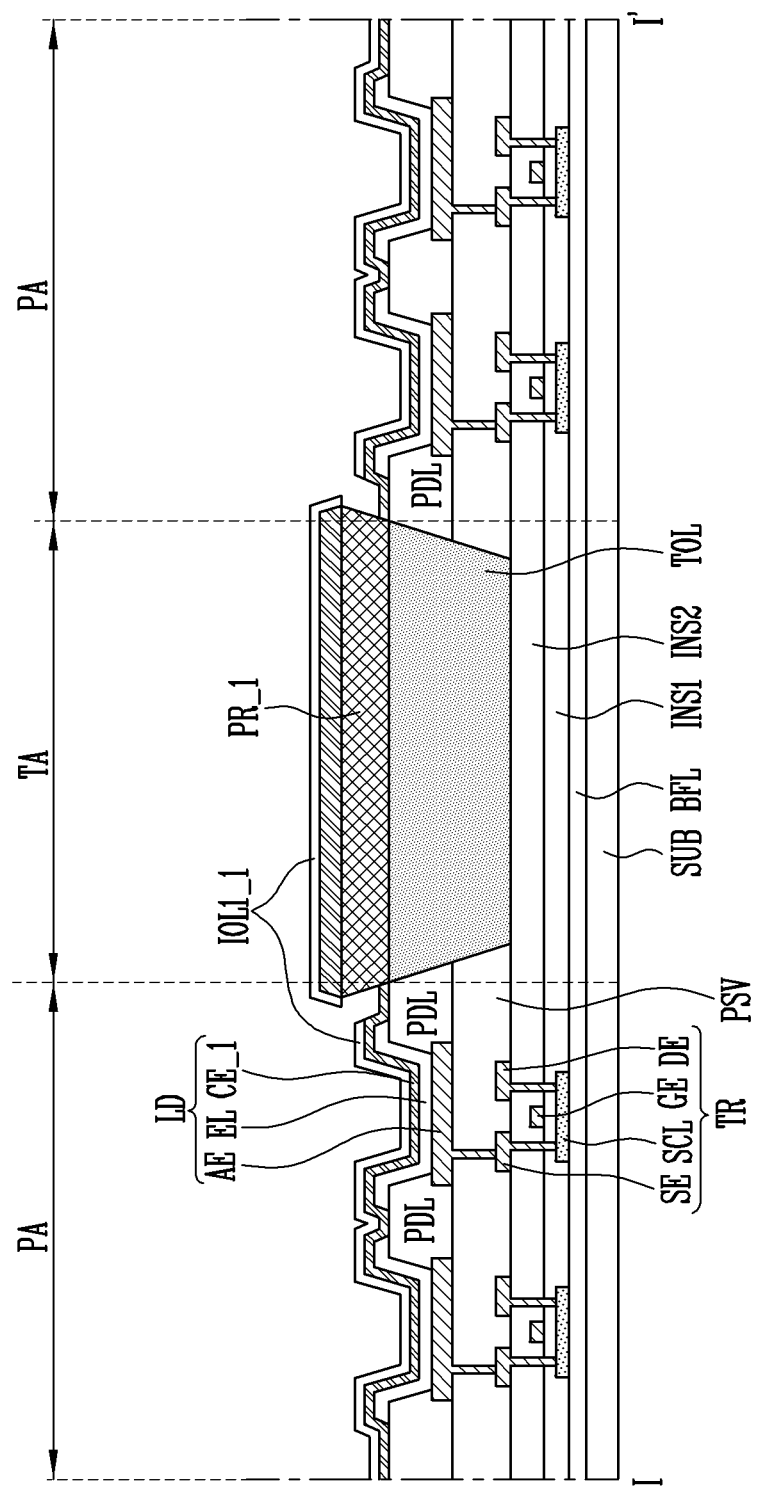

FIG. 8B and FIG. 8C are views for explaining a method of manufacturing the display device of FIG. 8A.

Referring to FIG. 6E and FIG. 8B, photoresist PR_1 may be formed so as to have a thickness that is thinner than the thickness of the photoresist PR described with reference to FIG. 6E in the process of forming the photoresist PR_1.

Alternatively, through the second mask MASK2_1 having a relatively smaller size than the second mask MASK2 illustrated in FIG. 6E, the photoresist PR_1 may be formed so as to have a cross-section of an inverse-tapered shape without a protrusion.

Alternatively, the dummy pattern MP_1 may be formed so as to be thicker than the dummy pattern MP described with reference to FIG. 6E and so as to have a relatively large inclination angle (that is, a relatively large taper angle, e.g., an angle close to a vertical axis).

Referring to FIG. 6H and FIG. 8C, depending on the shape of the lateral surface of the photoresist PR_1, the first electrode CE_1 is formed all over the pixel areas PA without a shadow area, whereby the first electrode CE_1 may be in contact with the lateral surface of the photoresist PR_1.

Referring to FIG. 6I and FIG. 8C, the edge of the first inorganic layer IOL1_1 in the pixel areas PA may be formed so as to be spaced apart from the photoresist PR_1 by the first electrode CE_1 formed on the photoresist PR_1.

As described with reference to FIGS. 8A to 8C, the first edge EG1_1 of the first electrode CE_1 may coincide with the boundary between the transmissive area TA and the pixel areas PA (or the edge of the transparent organic layer TOL).

Figure 9A:
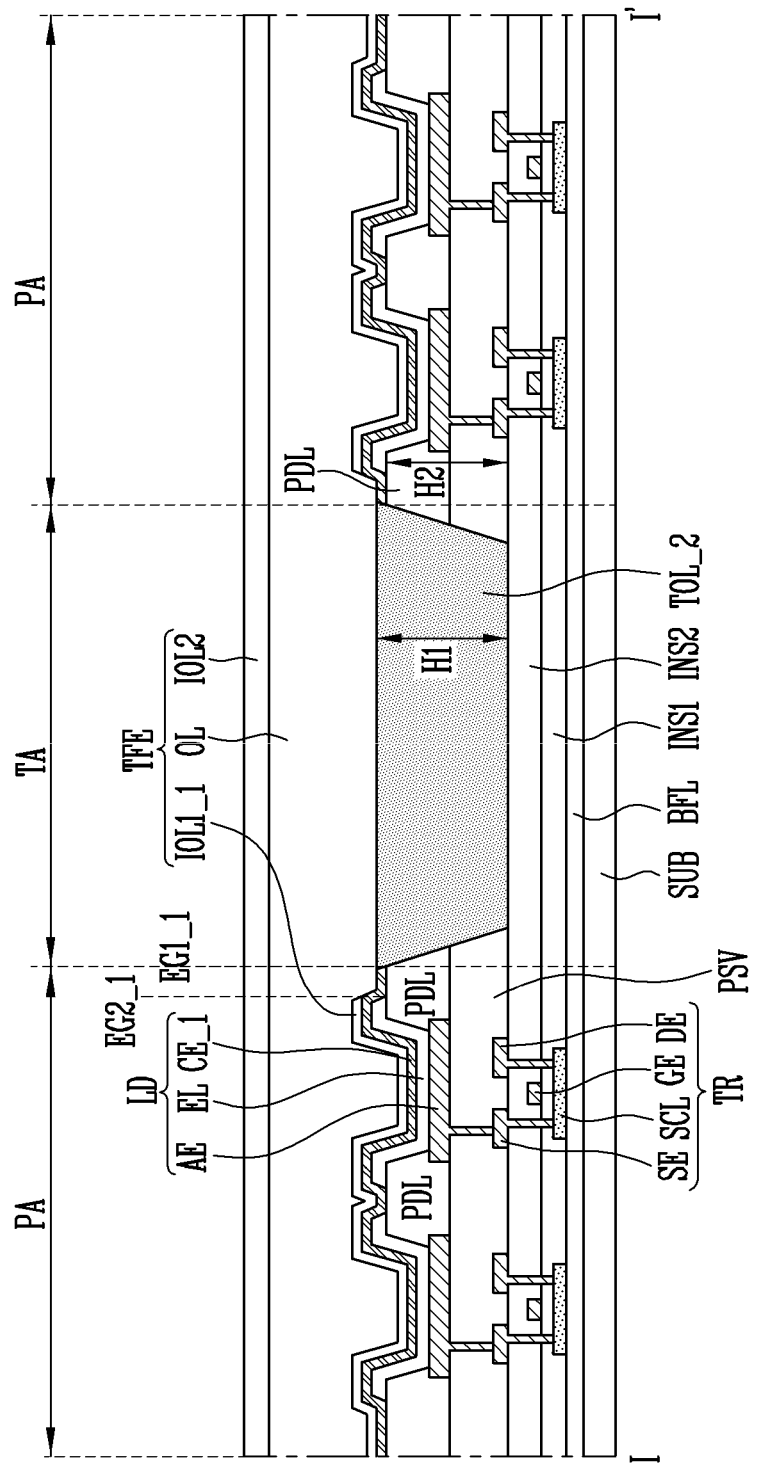
FIG. 9A and FIG. 9B are cross-sectional views illustrating yet another example of a display device, taken along the line I-I' of FIG. 3.
Figure 9B:
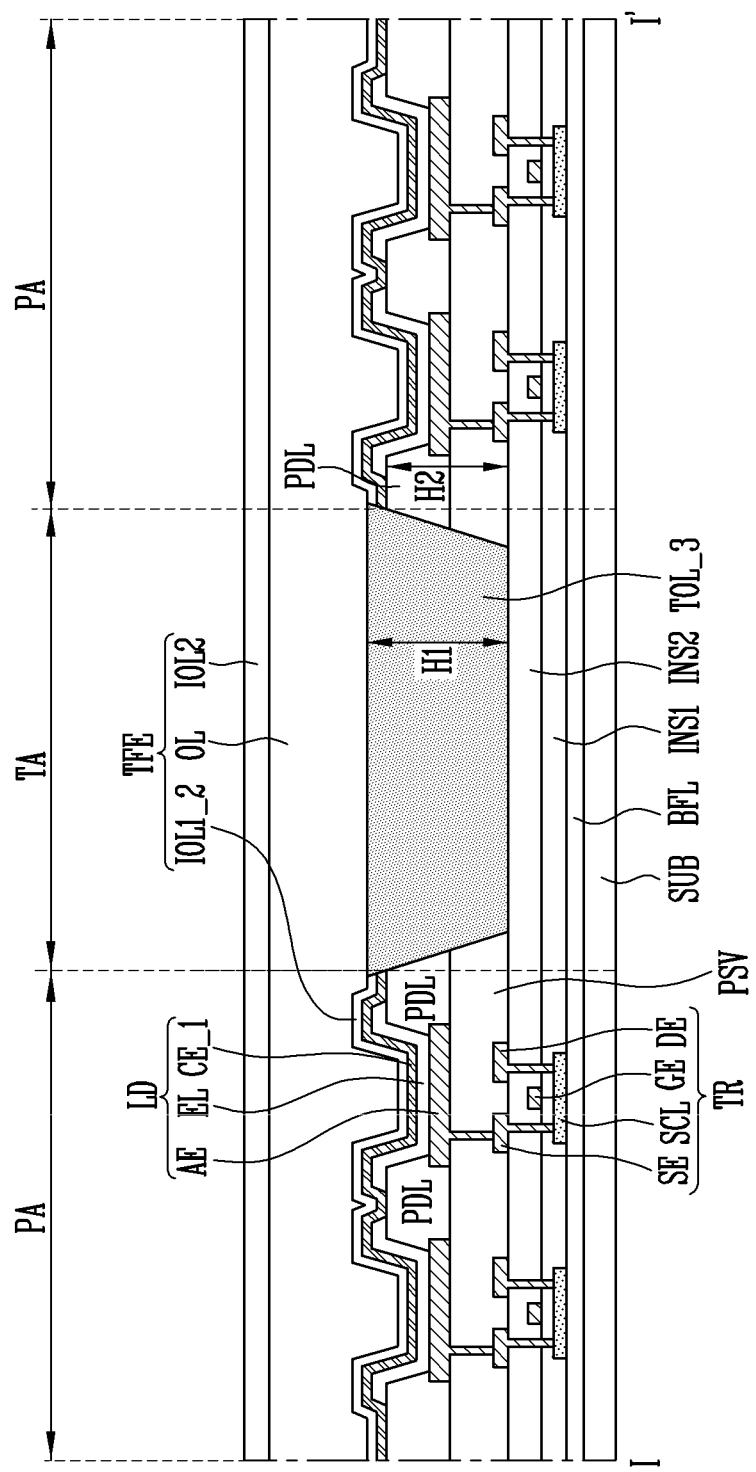

FIG. 9A and FIG. 9B are cross-sectional views illustrating yet another example of a display device, taken along the line I-I' of FIG. 3. In FIG. 9A and FIG. 9B, views corresponding to FIG. 8A are illustrated.

Referring to FIG. 8A, FIG. 9A and FIG. 9B, the display device of FIG. 9A and the display device of FIG. 9B may be the same as or similar to the display device of FIG. 8A, except for transparent organic layers TOL_2 and TOL_3. Therefore, a repeated description will be omitted.

As illustrated in FIG. 9A, the thickness H1 of the transparent organic layer TOL_2 may be greater than the total thickness H2 of the protective layer PSV and the pixel defining layer PDL. Also, based on the substrate SUB, the height of the transparent organic layer TOL_2 may be equal to the height of the first electrode CE_1 that is in contact with the transparent organic layer TOL_2.

In this case, the photoresist PR described with reference to FIG. 6E (or the lower surface of the photoresist PR) is formed further up the first electrode CE_1, and the photoresist PR may be more easily stripped in the process of stripping the photoresist PR.

As illustrated in FIG. 9B, the thickness H1 of the transparent organic layer TOL_3 may be greater than the total thickness H2 of the protective layer PSV and the pixel defining layer PDL. Also, with respect to the substrate SUB, the height of the transparent organic layer TOL_3 may be equal to the first inorganic layer IOL1_2 that is in contact with the transparent organic layer TOL_3.

The first inorganic layer IOL1_2 may be formed so as to be in contact with the transparent organic layer TOL_3 by adjusting at least one of the shape of the lateral surface (or the taper angle) or the height of the photoresist PR_1 described with reference to FIG. 8B or the shape of the lateral surface or the height of the dummy pattern MP_1 described with reference to FIG. 8B. In this case, the first electrode CE_1 is covered by the first inorganic layer IOL1_2 (and the transparent organic layer TOL_3), and may be spaced apart from the organic layer OL by the first inorganic layer IOL1_2, rather than being in contact with the organic layer OL.

The photoresist PR described with reference to FIG. 6E (or the lower surface of the photoresistor PR) is formed further up the first inorganic layer IOL1_2, and the photoresist PR may be more easily stripped in the process of stripping the photoresist PR.

Figure 10A:
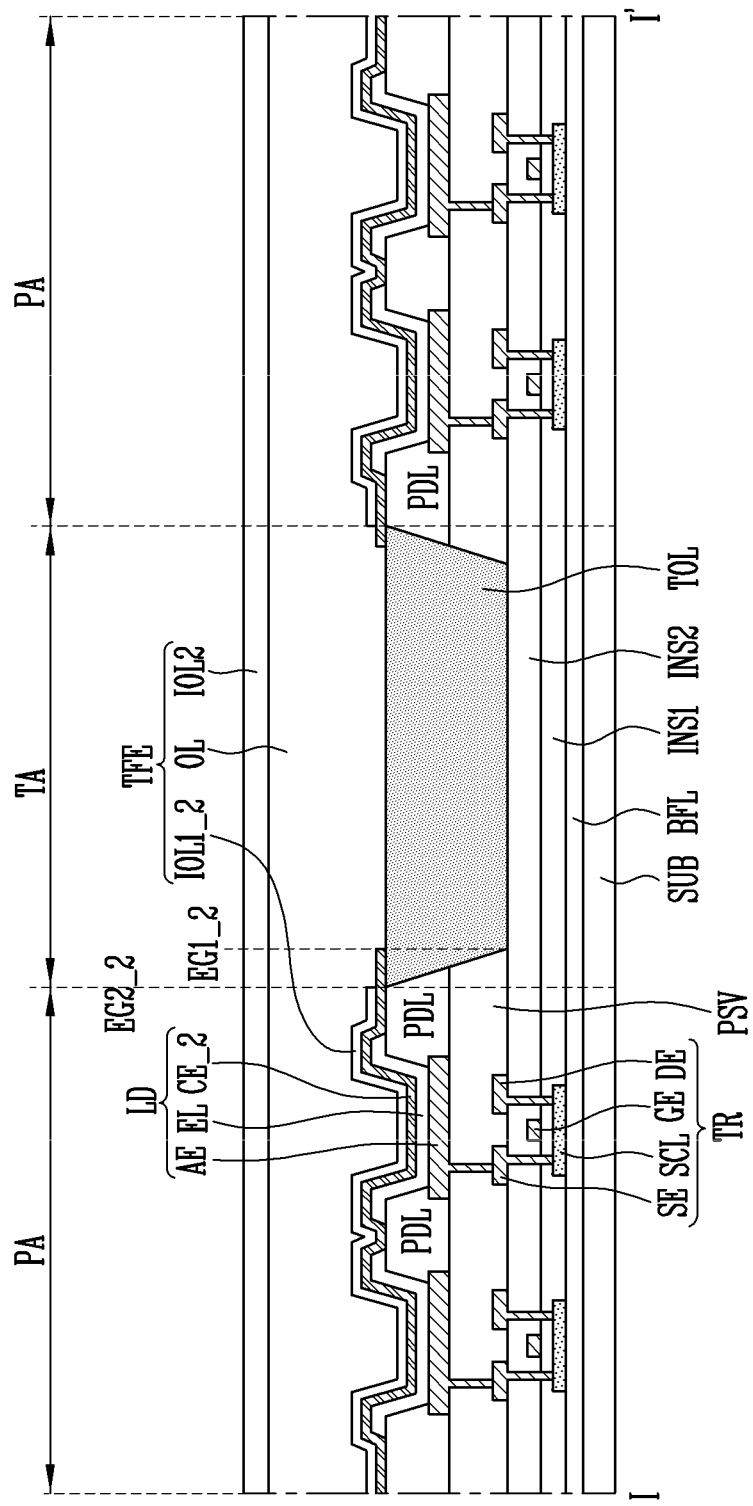
FIG. 10A is a cross-sectional view illustrating yet another example of a display device, taken along the line I-I' of FIG. 3.

FIG. 10A is a cross-sectional view illustrating further details of a display device according to some example embodiments, taken along the line I-I' of FIG. 3. In FIG. 10A, a view corresponding to FIG. 4 is illustrated.

Referring to FIG. 4 and FIG. 10A, the display device of FIG. 10A may be the same as or similar to the display device of FIG. 4, except for a first electrode CE_2 and a first inorganic layer IOL1_2. Therefore, some repeated description thereof may be omitted.

As illustrated in FIG. 10A, the first electrode CE_2 extends to the transmissive area TA, thereby covering the edge of the transparent organic layer TOL. For example, the first edge EG1_2 of the first electrode CE_2 may coincide with the edge of the lower surface of the transparent organic layer TOL.

The first inorganic layer IOL1_2 extends to the boundary between the transmissive area TA and the pixel areas PA, and for example, the second edge EG2_2 of the first inorganic layer IOL1_2 may coincide with the edge of the upper surface of the transparent organic layer TOL in a plan view.

As described with reference to FIG. 4, the distance between the first edge EG1_2 of the first electrode CE_2 and the second edge EG2_2 of the first inorganic layer IOL1_2 may be equal or similar to the thickness of the first electrode CE_2.

Figure 10B:
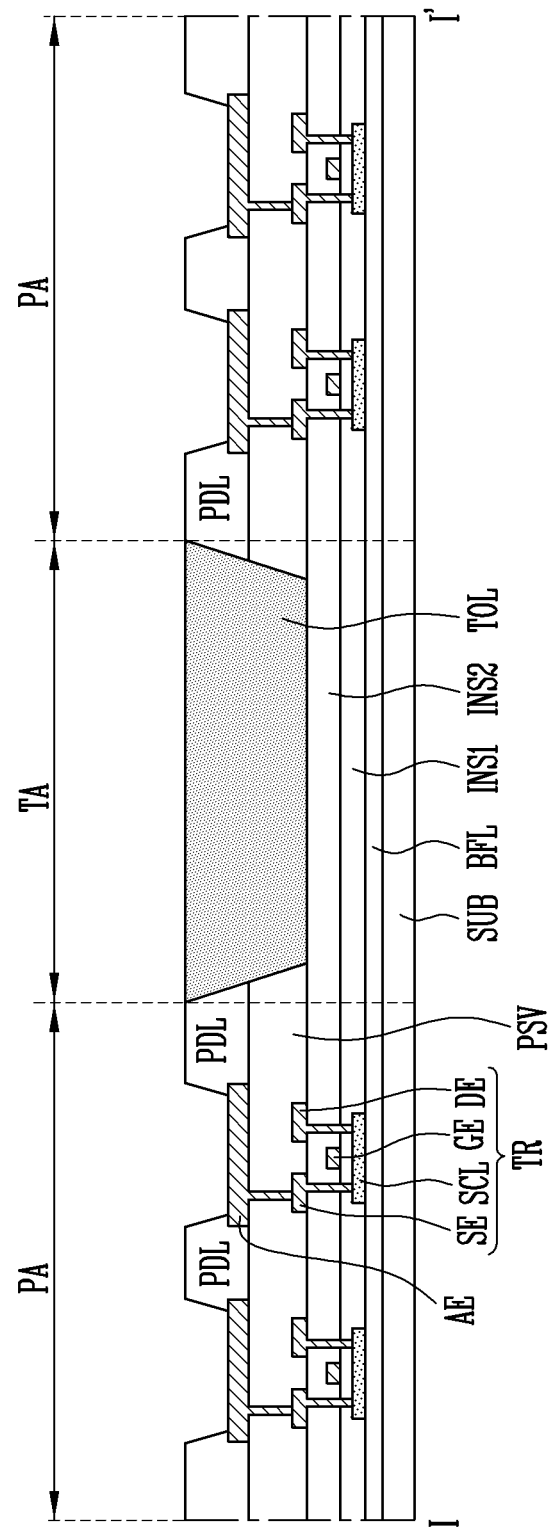
FIG. 10B and FIG. 10C are views for explaining the method of manufacturing the display device of FIG. 10A.
Figure 10C:
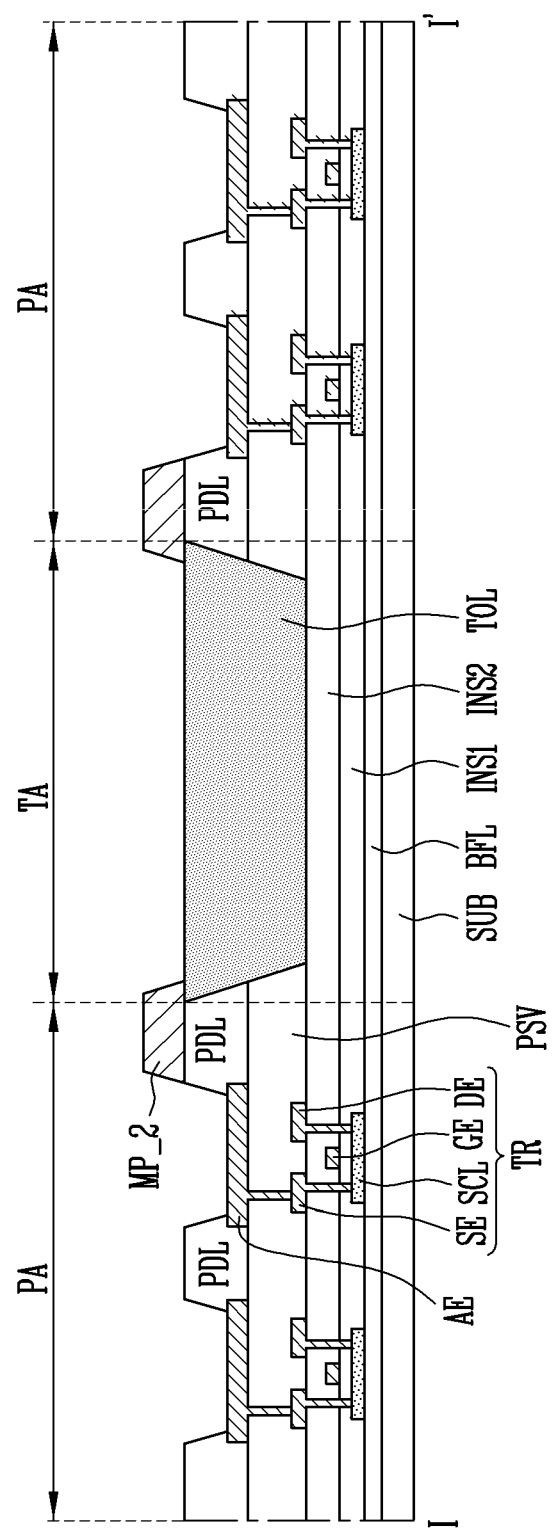

FIG. 10B and FIG. 10C are views for explaining a method of manufacturing the display device of FIG. 10A.

Referring to FIG. 6D, FIG. 10B and FIG. 10C, the transparent organic layer TOL is formed, and then the dummy pattern (e.g., MP_2 in FIG. 10C) may be formed.

When the panel described with reference to FIG. 6A is prepared, the transparent organic layer TOL may fill the first hole (e.g., OP1 in FIG. 6A) and the second hole (e.g., OP2 in FIG. 6A) within the transmissive area TA, as illustrated in FIG. 10B.

Then, along the edge of the transmissive area TA, the dummy pattern MP_2 may be formed on the boundary area between the pixel defining layer PDL and the transparent organic layer TOL, as illustrated in FIG. 10C.

Unlike the dummy pattern MP described with reference to FIG. 6B, the dummy pattern MP_2 may overlap the edge of the transparent organic layer TOL.

Accordingly, the photoresist PR described with reference to FIG. 6E is formed only within the transmissive area TA in a plan view, and the display device having the stack structure illustrated in FIG. 10A may be manufactured.

As described with reference to FIG. 10A to FIG. 10C, the first electrode CE_2 partially overlaps the transparent organic layer TOL, and the second edge EG2_2 of the first inorganic layer IOL1_2 may coincide with the boundary between the transmissive area TA and the pixel areas PA (or the edge of the transparent organic layer TOL).

A display device according to some example embodiments of the present disclosure may be configured such that only a transparent organic layer, an organic encapsulation layer, and a second inorganic encapsulation layer, which are sequentially stacked, are included in a transmissive area, and the first electrode (e.g., the cathode electrode) of a light-emitting element and a first inorganic encapsulation layer may not be included therein. Accordingly, the transmittance of the transmissive area may be improved, compared to when the first electrode and the first inorganic encapsulation layer are located in the transmissive area.

A method of manufacturing a display device according to some example embodiments of the present disclosure is configured such that photoresist is formed on a transparent organic layer using a dummy pattern and then the photoresist may be stripped after a first electrode and a first inorganic encapsulation layer are formed. Accordingly, the first electrode and the first inorganic encapsulation layer are not present in the transmissive area, whereby the transmittance of the transmissive area may be more improved.

Effects obtainable from embodiments are not limited by the above-mentioned effects, and various effects are included in this description.

While aspects of some example embodiments of the present disclosure have been described in some detail with reference to the drawings, it will be understood by those skilled in the art that the present disclosure can be implemented in other specific forms without changing the technical spirit or essential features of the present disclosure. Therefore, it should be noted that the forgoing embodiments are merely illustrative in all aspects and are not to be construed as limiting the present disclosure.

What is claimed is:

1. A display device, comprising:
    a substrate including pixel areas and a transmissive area between the pixel areas;
    a pixel circuit layer including at least one transistor on each of the pixel areas; and
    a light-emitting element layer on the pixel circuit layer and including at least one light-emitting element at each of the pixel areas and coupled to the at least one transistor, and a transparent organic layer at the transmissive area,
    wherein the light-emitting element layer further includes:
        a pixel defining layer having an opening corresponding to the at least one light-emitting element, wherein a surface of the transparent organic layer is coplanar with a surface of the pixel defining layer;
        a first electrode at the pixel areas,
        a first inorganic layer at the first electrode,
        an organic layer in contact with and covering the first inorganic layer and the transparent organic layer, and
        a second inorganic layer on the organic layer, and
    wherein the first electrode and the first inorganic layer do not overlap the transparent organic layer.

2. The display device according to claim 1, wherein the first electrode and the first inorganic layer are spaced apart from the transparent organic layer in a plan view, and
    wherein the first inorganic layer, the organic layer, and the second inorganic layer configure an encapsulation layer.

3. The display device according to claim 2, wherein one side of the first electrode facing the transparent organic layer includes a straight line.

4. The display device according to claim 2, wherein:
    a first edge of the first electrode is closer to the transparent organic layer than a second edge of the first inorganic layer, and
    a portion of the first electrode exposed by the first inorganic layer comes in contact with the organic layer.

5. The display device according to claim 4, wherein a distance between the first edge of the first electrode and the second edge of the first inorganic layer is equal or similar to a thickness of the first electrode.

6. The display device according to claim 1, wherein the light-emitting element layer further includes:
a second electrode on the pixel circuit layer,
the pixel defining layer on the second electrode and configured to expose the second electrode, and
an emission layer overlapping the second electrode exposed by the pixel defining layer, and
wherein the at least one light-emitting element comprises the first electrode, the second electrode, and the emission layer.

7. The display device according to claim 2, wherein:
the substrate further includes a first area and a second area,
in the first area, the pixel areas of the substrate are arranged in a grid shape so as to be spaced apart from each other, and the transmissive area is located between the pixel areas spaced apart from each other, and
in the second area, the pixel areas of the substrate are adjacent to each other.

8. The display device according to claim 7, wherein:
the first electrode is continuously formed on the pixel areas, and
a thickness of the first electrode is uniform throughout an entirety of the pixel areas.

9. The display device according to claim 8, wherein:
the first inorganic layer includes inorganic patterns that are separated from each other, and
the inorganic patterns are at the pixel areas, respectively.

10. The display device according to claim 1, wherein a refractive index of the transparent organic layer is within a range of 1.5 to 1.7.

11. The display device according to claim 1, wherein
a first edge of the first electrode coincides with an edge of the transparent organic layer in a plan view.

12. The display device according to claim 11, wherein a second edge of the first inorganic layer is spaced apart from the transparent organic layer in a plan view.

13. The display device according to claim 11, wherein a first lateral side of the first electrode and a second lateral side of the first inorganic layer, facing the transparent organic layer, are located on a same surface as a lateral side of the transparent organic layer.

* * * * *